US008637406B1

(12) United States Patent
Jung et al.

(10) Patent No.: US 8,637,406 B1
(45) Date of Patent: Jan. 28, 2014

(54) IMAGE TRANSFER PROCESS EMPLOYING A HARD MASK LAYER

(75) Inventors: Ryan O. Jung, Rensselaer, NY (US); Sivananda K. Kanakasabapathy, Niskayuna, NY (US); Yunpeng Yin, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/552,992

(22) Filed: Jul. 19, 2012

(51) Int. Cl.
*H01L 21/311* (2006.01)
(52) U.S. Cl.
USPC .......................................................... 438/703
(58) Field of Classification Search
None
See application file for complete search history.

(56) References Cited

U.S. PATENT DOCUMENTS

| 7,488,685 | B2 | 2/2009 | Kewley |
| 7,648,919 | B2 | 1/2010 | Tran et al. |
| 7,855,148 | B2 | 12/2010 | Olson |
| 7,892,982 | B2 * | 2/2011 | Lee et al. ....................... 438/717 |
| 8,053,317 | B2 | 11/2011 | Chakravarti et al. |
| 8,211,803 | B2 * | 7/2012 | Sandhu et al. ................. 438/696 |
| 8,334,211 | B2 * | 12/2012 | Kewley ........................... 438/696 |
| 2008/0206996 | A1 | 8/2008 | Furukawa et al. |
| 2010/0317193 | A1 | 12/2010 | Tran et al. |
| 2012/0276735 | A1 * | 11/2012 | Tagami ........................... 438/637 |

FOREIGN PATENT DOCUMENTS

EP          1861864 B1 * 12/2009

OTHER PUBLICATIONS

Burn J. Lin, Scope and Limit of Lithography to the End of Moore's Law, Mar. 2012, tsmc Inc.; Web Address: http://archive.sigda.org/ispd/ISPD12Slides/ISPD12_Keynote.pdf.*
La Pedus, M., "Applied Tips Double-Patterning Breakthrough" EE Times- News and Analysis (Feb. 27, 2007) 5:40 PM EST San Jose, California, URL: http://www.eetimes.com/showArticle.jhtml?articleID=197009227.
Tomizawa, H. et al., "Robust Self-Aligned Via Process for 64nm Pitch Dual-Damascene Interconnects using Pitch Split Double Exposure Patterning Scheme" IEEE (May 8-12, 2011) 3 pages.

* cited by examiner

*Primary Examiner* — Charles Garber
*Assistant Examiner* — Syed Gheyas
(74) *Attorney, Agent, or Firm* — Scully, Scott, Murphy & Presser, P.C.; Daniel P. Morris

(57) ABSTRACT

At least one mask layer formed over a substrate includes at least one of a dielectric material and a metallic material. By forming a first pattern in one of the at least one mask layer, a patterned mask layer including said first pattern is formed. An overlying structure including a second pattern that includes at least one blocking area is formed over said patterned mask layer. Portions of said patterned mask layer that do not underlie said blocking area are removed. The remaining portions of the patterned mask layer include a composite pattern that is an intersection of the first pattern and the second pattern. The patterned mask layer includes a dielectric material or a metallic material, and thus, enables high fidelity pattern transfer into an underlying material layer.

24 Claims, 29 Drawing Sheets

IMAGE TRANSFER PROCESS EMPLOYING A HARD MASK LAYER

BACKGROUND

The present disclosure generally relates to a process for manufacturing semiconductor structures, and particularly to an image transfer process employing a hard mask layer to memorize a composite pattern, and structures for effecting the same.

A trilayer lithography process as known in the art employs an organic material layer such as an amorphous carbon layer in order to transfer a composite image of two independent images. The sidewalls of the organic material layer are formed with a significant level of line edge roughness and line width roughness during a pattern transfer etch that forms a pattern in the organic material layer employing an overlying layer as a patterned mask because the organic material layer is prone to lateral etching. The line edge roughness and the line width roughness of the organic material layer are further increased during a subsequent pattern transfer etch that transfers the pattern in the organic material layer into an underlying layer employing the organic material layer as an etch mask. The increased line edge roughness and line width roughness in the organic material layer is at least partly transferred into the underlying layer. Thus, the fidelity of pattern transfer is degraded due to the lateral etching of the organic material layer in the material stack employed for the trilayer lithography process.

BRIEF SUMMARY

At least one mask layer formed over a substrate includes at least one of a dielectric material and a metallic material. By forming a first pattern in one of the at least one mask layer, a patterned mask layer including said first pattern is formed. An overlying structure including a second pattern that includes at least one blocking area is formed over said patterned mask layer. Portions of said patterned mask layer that do not underlie said blocking area are removed. The remaining portions of the patterned mask layer include a composite pattern that is an intersection of the first pattern and the second pattern. The patterned mask layer includes a dielectric material or a metallic material, and thus, enables high fidelity pattern transfer into an underlying material layer.

According to an aspect of the present disclosure, a method of patterning a structure is provided. At least one mask layer including at least one of a dielectric material and a metallic material is formed over a substrate. A first pattern is formed in one of the at least one mask layer. A patterned mask layer including the first pattern is thus formed. An overlying structure including a second pattern over the patterned mask layer is subsequently formed. The second pattern includes at least one blocking area. Portions of the patterned mask layer that do not underlie the blocking area are removed. Remaining portions of the patterned mask layer include a composite pattern that is an intersection of the first pattern and the second pattern.

According to another aspect of the present disclosure, a lithographic structure is provided, which includes an underlying material layer located on a substrate, at least one mask layer including at least one of a dielectric material and a metallic material and located over the underlying material layer, an organic planarizing layer (OPL) located over the at least one mask layer, an antireflective coating (ARC) layer located on the OPL, and a patterned structure located over the ARC layer.

According to yet another aspect of the present disclosure, another lithographic structure is provided, which includes an underlying material layer located on a substrate, a patterned mask layer including at least one of a dielectric material and a metallic material and located over the underlying material layer, an organic planarizing layer (OPL) located over the patterned mask layer, an antireflective coating (ARC) layer located on the OPL, and a photoresist layer located over the ARC layer and including at least one opening therein.

DETAILED DESCRIPTION

Figure 1:
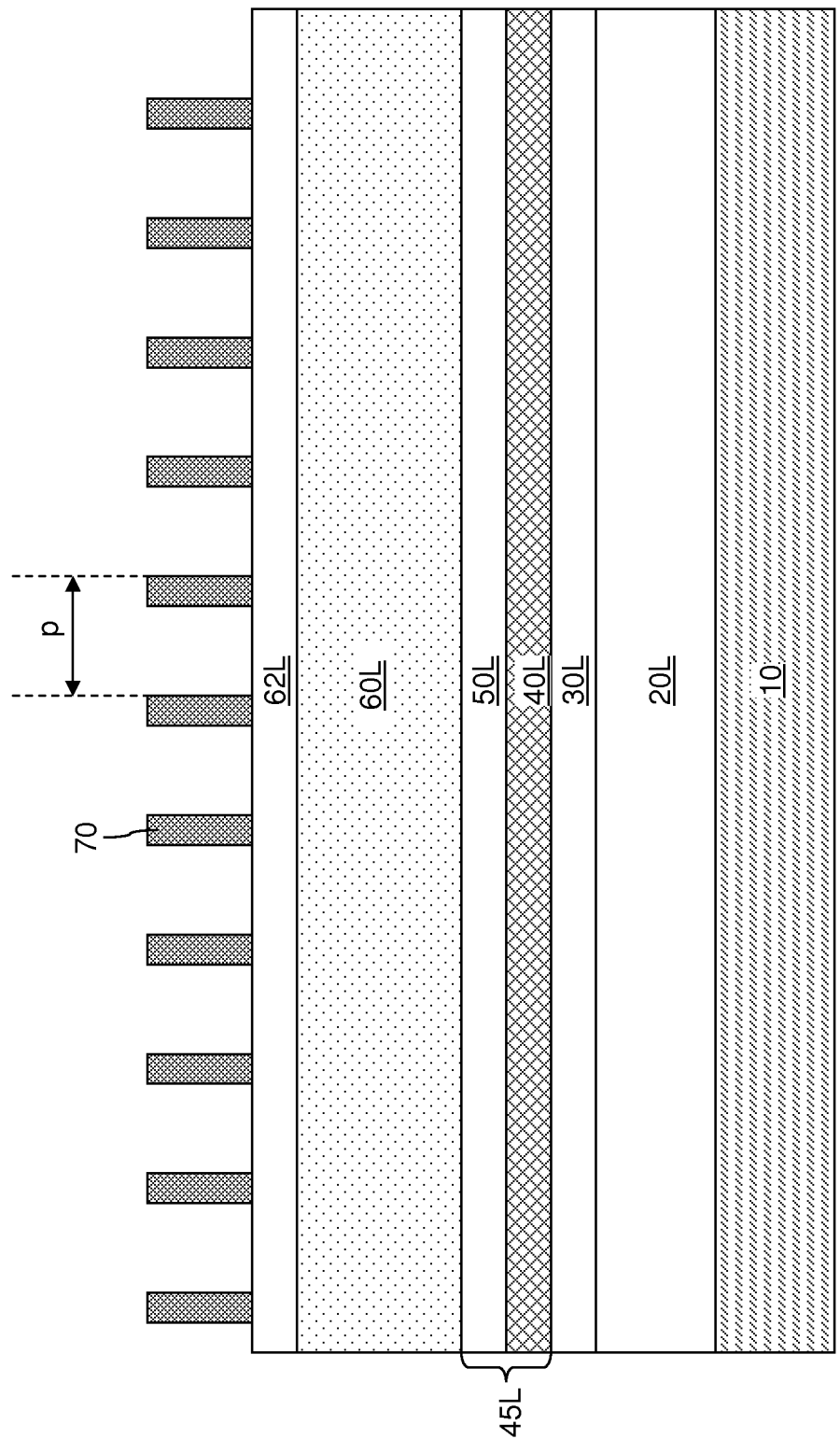
FIG. 1 is a vertical cross-sectional view of a first exemplary structure after deposition of an underlying material layer, and optional dielectric material layer, a dielectric mask layer, a metallic mask layer, a first organic planarizing layer (OPL), a first antireflective coating (ARC) layer, and mandrel structures according to a first embodiment of the present disclosure.

As stated above, the present disclosure relates to an image transfer process employing a hard mask layer to memorize a composite pattern and structures for effecting the same, which are now described in detail with accompanying figures. It is noted that like reference numerals refer to like elements across different embodiments. The drawings are not necessarily drawn to scale.

FIG. 1 is a vertical cross-sectional view of a first exemplary structure after deposition of an underlying material layer, and optional dielectric material layer, a dielectric mask layer, a metallic mask layer, a first organic planarizing layer (OPL), a first antireflective coating (ARC) layer, and mandrel structures according to a first embodiment of the present disclosure.

Referring to FIG. 1, a first exemplary structure according to a first embodiment of the present disclosure includes a substrate 10 and a material stack formed thereupon. The substrate 10 can include a semiconductor substrate having semiconductor devices (not shown) therein. The semiconductor devices can include, for example, field effect transistors, junction transistors, diodes, resistors, capacitors, inductors, or any other semiconductor device known in the art. The substrate 10 may, or may not, include contact-level dielectric material layers (not shown) and/or interconnect level dielectric material layers (not shown) as well as embedded contact via structures (not shown) and/or embedded wiring level metal interconnect structures. Alternately, the topmost portion of the substrate 10 can include a semiconductor material such as single crystalline silicon.

An underlying material layer 20L can be formed on the substrate 10. The underlying material layer 20L can be a conductive material layer, a plurality of conductive material layers, a single dielectric material layer, a plurality of dielectric material layers, or a stack of at least one dielectric material layer and a conductive material layer. For example, the underlying material layer 20L can be a stack of gate level layers, a wiring-level dielectric material layer, a contact-level dielectric material layer, a conductive material layer such as a metal layer or a doped semiconductor layer. Exemplary materials that can be included in the underlying material layer include, but are not limited to, gate dielectric materials known in the art, gate conductor materials known in the art, doped semiconductor materials, and conductive metallic materials, silicon oxide, silicon nitride, silicon oxynitride, organosilicate glass, and stacks thereof. The underlying material layer 20L can be deposited, for example, by chemical vapor deposition (CVD), spin coating, or by any other deposition method known in the art. The thickness of the underlying material layer 20L can be from 10 nm to 2,000 nm, although lesser and greater thicknesses can also be employed. In one embodiment, the underlying material layer 20L can be a stack of a gate dielectric layer and a gate conductor layer.

An optional dielectric material layer 30L can be optionally deposited on the top surface of the underlying material layer 20L. The optional dielectric material layer 30L can be, for example, a silicon nitride layer or a silicon oxide layer. If the optional dielectric material layer 30L includes silicon nitride or silicon oxide, the optional dielectric material layer 30L can be deposited by a chemical vapor deposition (CVD). The thickness of the optional dielectric material layer 30L can be from 30 nm to 300 nm, although lesser and greater thicknesses can also be employed. In one embodiment, the underlying material layer 20L can be a stack of gate dielectric layer and a gate conductor layer, and the optional dielectric material layer 30L can be a gate cap dielectric layer including silicon nitride or silicon oxide.

At least one mask layer 45L is subsequently deposited on the optional dielectric material layer 30L or the underlying material layer 20L (if an optional dielectric material layer is not present). The at least one mask layer 45L can include at least one of a dielectric material and a metallic material. The at least one mask layer 45L can be a stack, from bottom to top, of a dielectric mask layer 40L and a metallic mask layer 50L. Alternately, the at least one mask layer 45L can be a stack, from bottom to top, of a metallic mask layer 50L and a dielectric mask layer 40L. Yet alternately, the at least one mask layer 45L can be a single layer of a dielectric mask layer 40L. Still alternately, the at least one mask layer 45L can be a single layer of a metallic mask layer 50L.

The dielectric mask layer 40L includes a dielectric material, which can be silicon oxide, silicon nitride, silicon oxynitride, a dielectric metal oxide such as $HfO_2$, $LaO_2$, or $TiO_2$, or a combination thereof. The dielectric mask layer 40L can be deposited, for example, by chemical vapor deposition (CVD), physical vapor deposition (PVD), or a combination thereof. The thickness of the dielectric mask layer 40L can be from 10 nm to 100 nm, although lesser and greater thicknesses can also be employed.

If the dielectric mask layer 40L includes silicon oxide, the dielectric mask layer 40L can be deposited by a chemical vapor deposition (CVD) using tetraethylorthosilicate (TEOS) as a precursor material. Silicon oxide derived from TEOS, commonly referred to as TEOS oxide, can be deposited by low pressure chemical vapor deposition (LPCVD) or plasma enhanced chemical vapor deposition (PECVD).

A metallic mask layer 50L is deposited on the dielectric mask layer 40L. The metallic mask layer 50L includes a conductive material. Exemplary conductive materials that can be employed for the metallic mask layer 50L include, but are not limited to, TiN, TaN, WN, TiC, TaC, WC, Ti, Ta, W, and combinations thereof. For example, the metallic mask layer 50L can be a TiN layer. The metallic mask layer 50L can be deposited, for example, by physical vapor deposition (PVD), chemical vapor deposition (CVD), or a combination thereof. The thickness of the metallic mask layer 50L can be from 10 nm to 100 nm, although lesser and greater thicknesses can also be employed.

A first organic planarizing layer (OPL) 60L is deposited on the top surface of the at least one mask layer 45L, which can be the top surface of the metallic mask layer 50L. The first OPL 60L includes a non-photosensitive organic polymer including carbon, hydrogen, oxygen, and optionally fluorine. For example, the first OPL 60L can include hydrocarbons and/or hydrofluorocarbons. The first OPL 60L can be formed, for example, by spin coating. The thickness of the first OPL 60L can be from 30 nm to 300 nm, although lesser and greater thicknesses can also be employed.

A first antireflective coating (ARC) layer 62L is deposited on the first OPL 60L. The antireflective coating (ARC) layer is herein referred to as the first antireflective coating (ARC) layer 62L. The first ARC layer 62L can include a hydrocarbon based material having a different material composition than the first OPL 60L. In one embodiment, the first ARC layer 62L comprises silicon at an atomic concentration from 1% to 50%. In another embodiment, the first ARC layer 62L comprises a refractory metal at an atomic concentration from 1% to 50%. The first ARC layer 62L controls reflectivity of the surface (i.e., the surface of the metallic mask layer 50L) over which the first OPL 60L is patterned by reducing standing waves and optical notching. The thickness of the first ARC layer 62L may be from 10 nm to 150 nm, and typically from 20 nm to 80 nm, although lesser and greater thicknesses are explicitly contemplated herein. The first ARC layer 62L can be applied, for example, by spin coating.

A mandrel material layer (not shown) is deposited on the first ARC layer 62L. The mandrel material layer can include a photoresist, an amorphous carbon layer, or a material that can be removed selective to the material of a conformal material layer to be subsequently deposited. The mandrel material layer is deposited as a blanket layer (unpatterned layer), for example, by chemical vapor deposition (CVD) or spin coating. The thickness of the mandrel material layer can be from 30 nm to 300 nm, although lesser and greater thicknesses can also be employed.

In one embodiment, the mandrel material layer is a photoresist layer that can be directly patterned by lithographic exposure and development. The mandrel material layer is patterned by lithographic means, i.e., exposure and development, to form mandrel structures 70. The lithographic pattern may be a pattern of a periodic array, or may be an irregular pattern. In one embodiment, the lithographic pattern is a pattern of a regular periodic array. The lithographic pattern may contain an array of lines and spaces, or may contain a pattern of via holes in a matrix of the mandrel material layer, or may contain a pattern of isolated structures separated from one another by a contiguous cavity that laterally surrounds each isolated structure, i.e., each mandrel structure 70. Each of the mandrel structures 70 may be separated from one another as in the case of a lithographic pattern containing an array of lines and spaces, or may be adjoined among one another as in the case of a lithographic pattern containing an array of via holes.

In case the pattern in the mandrel structures 70 comprises a periodic one dimensional array, the pitch of the pattern in the mandrel structures 70 is a lithographic dimension, which is herein referred to as a lithographic pitch p. If the pattern in the mandrel structures 70 is a pattern of lines and spaces, the lithographic pitch p is the lateral dimension of a unit pattern comprising one line and one space. If the pattern in the mandrel structures 70 is a pattern of via holes in a matrix of a contiguous mandrel structure 70, the lithographic pitch is the lateral dimension of a unit pattern comprising at least one via hole. In addition to having periodicity in one direction at the lithographic pitch p, the pattern in the mandrel structures 70 may have another periodicity in another direction. Optionally, overexposure or underexposure may be employed so that the width of each pattern between a neighboring pair of the mandrel structures 70 is less than one half of the lithographic pitch p.

The lithographic pitch p is a lithographic dimension, i.e., a dimension that may be formed by lithographic means. The lithographic pitch p is the same as, or greater than, the minimum lithographic pitch that may be obtained by commercially available lithography tools. For example, if ArF lithography employing 193 nm wavelength light is used, the lithographic pitch p is the same as, or greater than 80 nm, which is the lithographic minimum pitch.

In other embodiments, the mandrel material layer includes amorphous carbon or other non-photosensitive material. In such embodiments, a photoresist (not shown) can be applied over the mandrel material and is lithographically patterned into shapes including multiple parallel lines. In one embodiment, the multiple parallel lines can have the same width and the same pitch. The pitch of the multiple parallel lines is a lithographic pitch, i.e., a pitch that can be printed by a single lithographic exposure employing a commercially available lithography tool and photoresist. A minimum lithographic pitch is herein referred to as a critical pitch, and a pitch that is less than the critical pitch is herein referred to as a sublithographic pitch. The pattern in the photoresist is transferred into the mandrel material layer to pattern the mandrel material layer into mandrel structures 70. In the case amorphous carbon or even amorphous silicon is employed as the mandrel material, the first OPL layer 60 can be replaced by a organic layer that has degas temperature higher than the mandrel deposition temperature. In one embodiment, OPL layer 60 can be replaced by amorphous carbon material through CVD deposition.

In one embodiment, the mandrel structures 70 can have parallel sidewalls. The parallel sidewalls of the mandrel structures 70 may vertically coincide with parallel sidewalls of the patterned photoresist, or may be laterally recessed inward (so that the mandrel structures 70 have lesser widths than the widths of the patterned photoresist). In one embodiment, the mandrel structures 70 have a lithographic pitch in one direction, which is a horizontal direction perpendicular to the parallel sidewalls of the mandrel structures 70.

Figure 2:
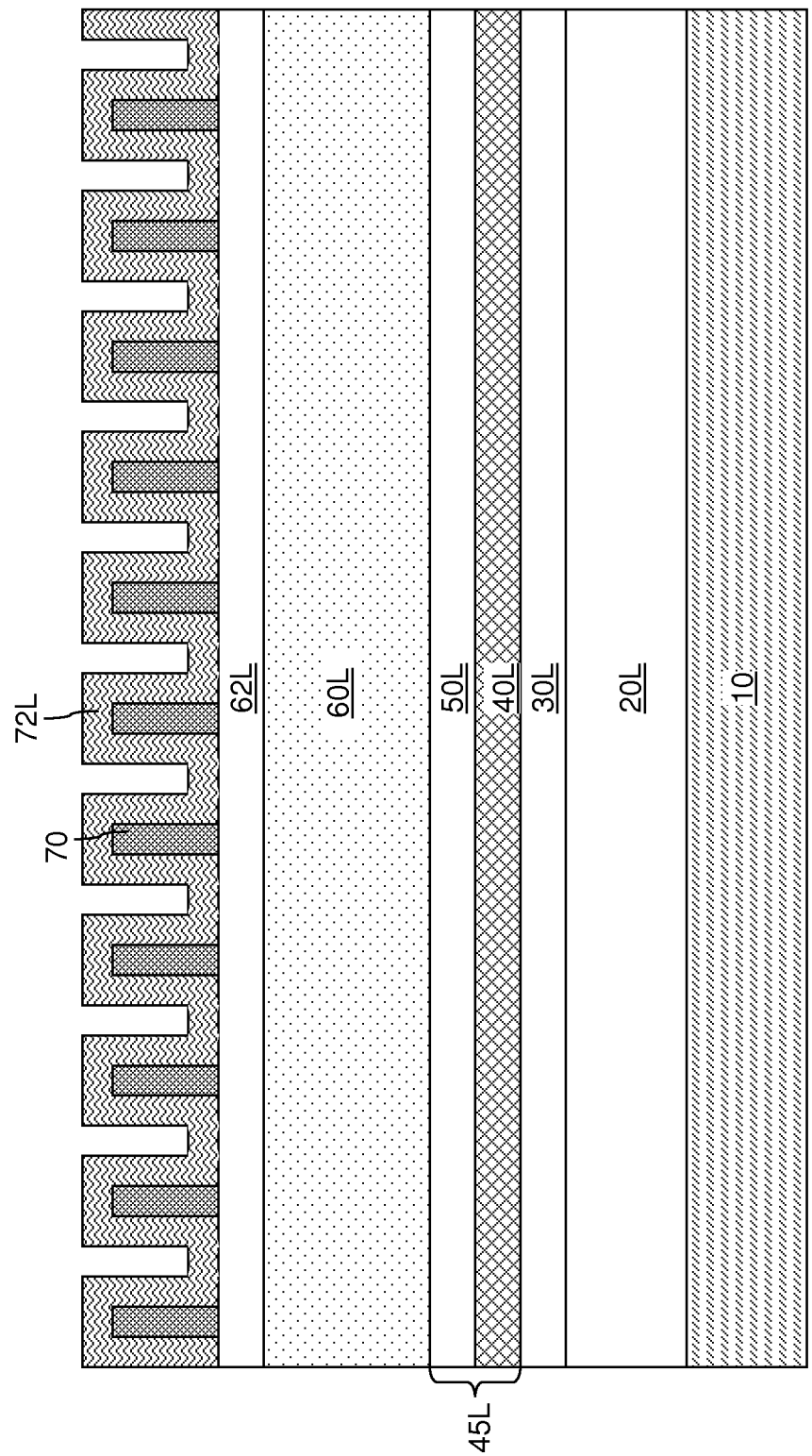
FIG. 2 is a vertical cross-sectional view of the first exemplary structure after deposition of a conformal material layer according to the first embodiment of the present disclosure.

Referring to FIG. 2, a conformal material layer 72L is deposited on the mandrel structures 70 and the exposed top surface of the first ARC layer 62L. The conformal material layer 72L is deposited employing a conformal deposition method such as molecular layer deposition (MLD), in which multiple reactants are alternately provided in a process chamber to deposit the conformal material layer. In MLD, the deposition of the material of the conformal material layer 72L occurs one molecular layer at a time. The dielectric material of the conformal material layer 72L can include, but is not limited to, silicon oxide, silicon nitride, or a combination thereof. The temperature of the deposition process is maintained below the decomposition temperature of the material of the mandrel structures 70.

In one embodiment, the mandrel structures 70 include a photoresist, and the conformal material layer includes silicon dioxide. Silicon oxide can be deposited at room temperature employing a molecular layer deposition process.

In another embodiment, the mandrel structures 70 include amorphous carbon, and the conformal material layer includes silicon oxide or silicon nitride. Silicon nitride can be deposited at a temperature about 400° C. employing a molecular layer deposition process.

Any other combination of materials for the mandrel structures 70 and the conformal material layer 72L can be employed provided that the material of the mandrel structures 70 can withstand the deposition process for the conformal material layer, that the conformal material layer 72L can be conformally deposited on the sidewalls of the mandrel structures 70, and that the mandrels can be removed selective to the material of the conformal material layer 72L and the first ARC layer 62L.

Figure 3:
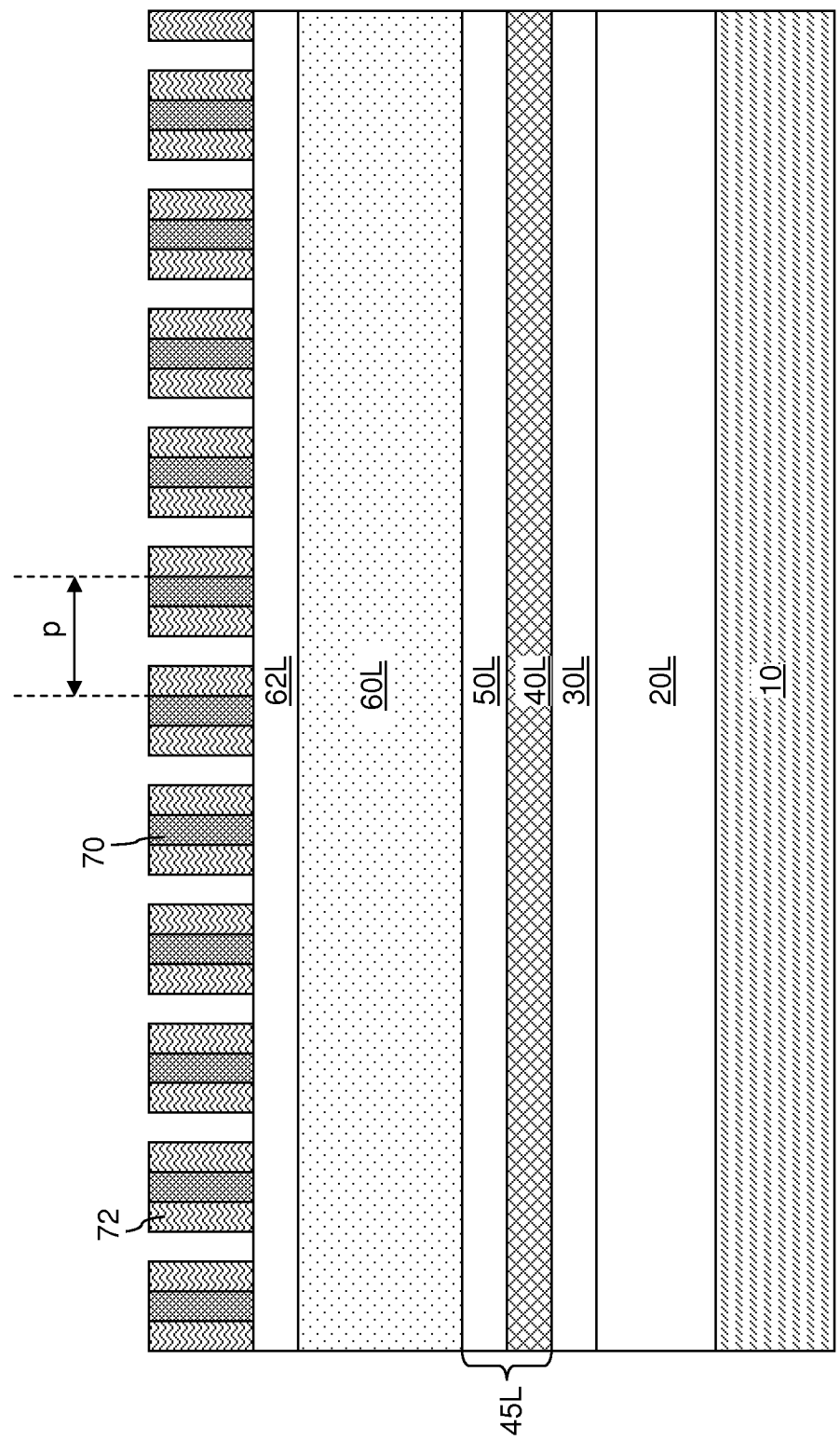
FIG. 3 is a vertical cross-sectional view of the first exemplary structure after formation of a set of spacer structures according to the first embodiment of the present disclosure.

Referring to FIG. 3, an anisotropic etch is performed to remove horizontal portions of the conformal material layer 72L. The vertical portions of the conformal material layer 72L that remains on the vertical sidewalls of the mandrels constitute a set of spacer structures 72, which include the same dielectric material as the conformal material layer 72L. Thus, the remaining disjoined portions of the conformal material layer 72L are the set of spacer structures 72. In one embodiment, the mandrel structures 70 can be patterned line structures having parallel vertical sidewalls. Each spacer structure 72 has a same width, and laterally surrounds and contacts a mandrel structure 70. Each of said spacer structures 72 can have a same lateral width, which can be the same as the thickness of the conformal material layer 72 as deposited.

The pattern in the spacer structures 72 is herein referred to as a first pattern. The spacer structures 72 collectively constitute a patterned structure including the first pattern. In one embodiment, the spacer structures can have a pitch that is one half of the lithographic pitch p. In this case, the patterned structure can include spacer structures 72 having a sublithographic pitch.

Each of the spacer structures 72 can laterally contact and laterally surround one of the mandrel structures 70. In one embodiment, the mandrel structures 70 can include a photoresist material. In another embodiment, the mandrel structures 70 can include amorphous carbon.

Figure 4:
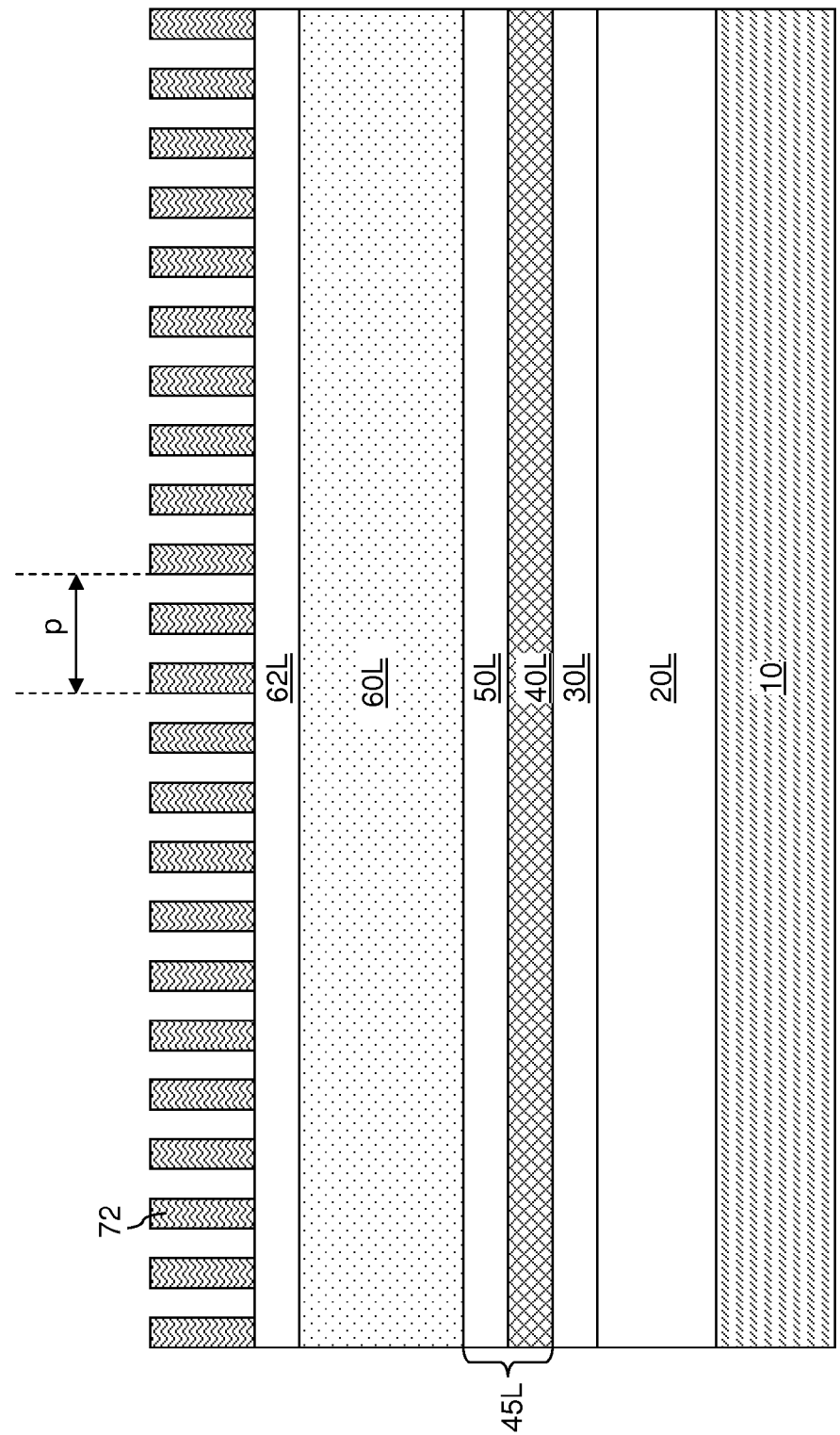
FIG. 4 is a vertical cross-sectional view of the first exemplary structure after removal of the mandrel structures according to the first embodiment of the present disclosure.

Referring to FIG. 4, the mandrel structures 70 are removed by another etch, which can be an anisotropic etch or an isotropic etch, that is selective to the materials of the spacer structures 72 and the first ARC layer 62L.

In one embodiment, the first pattern may include two patterned line structures within a lithographic pitch p. If the lithographic pitch is a minimum lithographic pitch that can be lithographically printed, the width of the spacer structures 72 can be a sublithographic width, i.e., a width that is less than the minimum width of a patterned structure that can be formed by single exposure and development.

The first exemplary structure illustrated in FIG. 4 is a lithographic structure, which includes the underlying material layer 20L located on the substrate 10; at least one mask layer 45L including at least one of a dielectric material and a metallic material and located over the underlying material layer 20L; the first organic planarizing layer (OPL) 60L located over the at least one mask layer 45L; the first antireflective coating (ARC) layer 62L located on the first OPL 60L; and the patterned structure of the spacer structures 72 located over the first ARC layer 62L. In one embodiment, the patterned structure has a pattern of a plurality of parallel lines, i.e., the first pattern can be a pattern of a plurality of parallel lines.

Each of the at least one mask layer 45L can be a blanket layer having a same thickness throughout, i.e., an unpatterned material layer. In one embodiment, the at least one mask layer 45L can be a stack, from bottom to top, of the dielectric mask layer 40L and the metallic mask layer 50L. In another embodiment, the at least one mask layer 45L can be a stack, from bottom to top, of a metallic mask layer 50L and a dielectric mask layer 40L. In yet another embodiment, the at least one mask layer 45L can be a single layer of a dielectric mask layer 40L. In still another embodiment, the at least one mask layer 45L can be a single layer of a metallic mask layer 50L.

Figure 5:
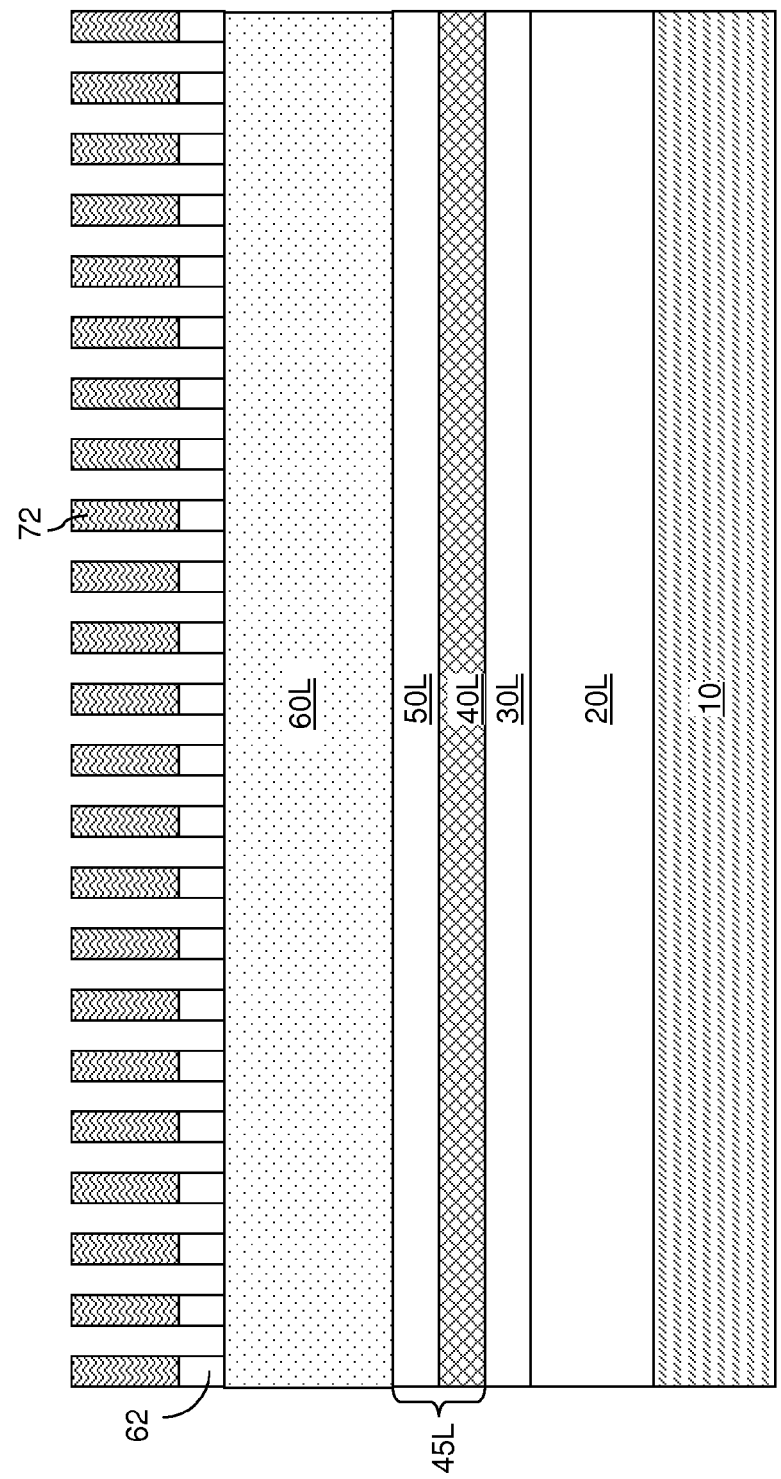
FIG. 5 is a vertical cross-sectional view of the first exemplary structure after transfer of a first pattern in the set of spacer structures into the first ARC layer according to the first embodiment of the present disclosure.

Referring to FIG. 5, the first pattern in the set of spacer structures 72 is transferred into the first ARC layer 62L by an anisotropic etch. The set of spacer structures 72 is employed as an etch mask during the transfer of the first pattern into the first ARC layer 62L. The first ARC layer 62L becomes a patterned first ARC layer 62, which includes a plurality of ARC portions that replicate the first pattern.

Figure 6:
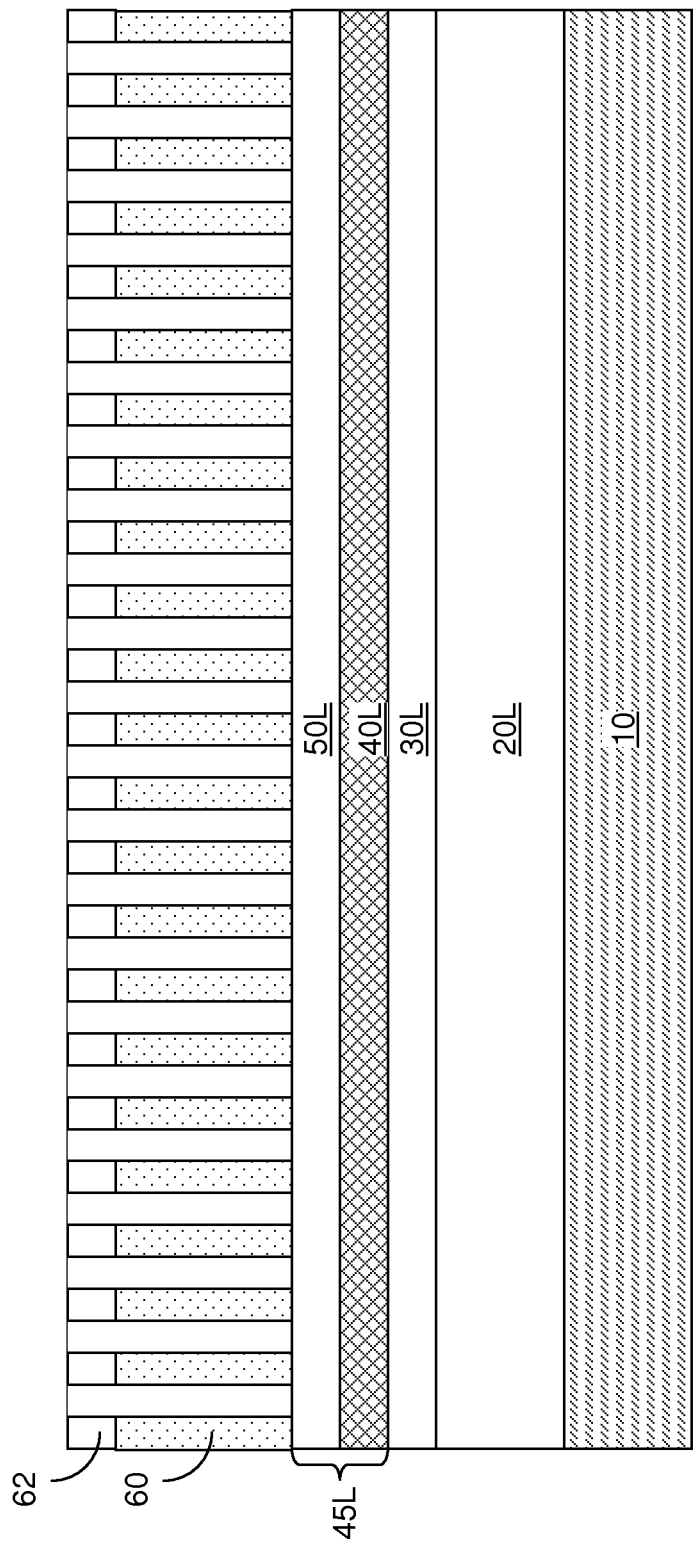
FIG. 6 is a vertical cross-sectional view of the first exemplary structure after transfer of the first pattern into the first OPL according to the first embodiment of the present disclosure.

Referring to FIG. 6, the first pattern is transferred into the first OPL 60L by another anisotropic etch. The anisotropic etch employs the set of spacer structures 72 and/or the patterned first ARC layer 62 as the etch mask. For example, the set of spacer structures 72 can be consumed during an initial portion of the anisotropic and consumed before the end of the anisotropic etch, and the patterned first ARC layer 62 can be employed as the etch mask during a latter portion of the anisotropic etch. Alternately, the set of spacer structures 72 can be employed as the etch mask layer throughout the anisotropic etch, and removed selective to the material of the first OPL 60L after the anisotropic etch. The first OPL 60L becomes a patterned first OPL 60 by the anisotropic etch, which includes a plurality of OPL portions. The patterned first OPL 60 includes the first pattern.

Figure 7:
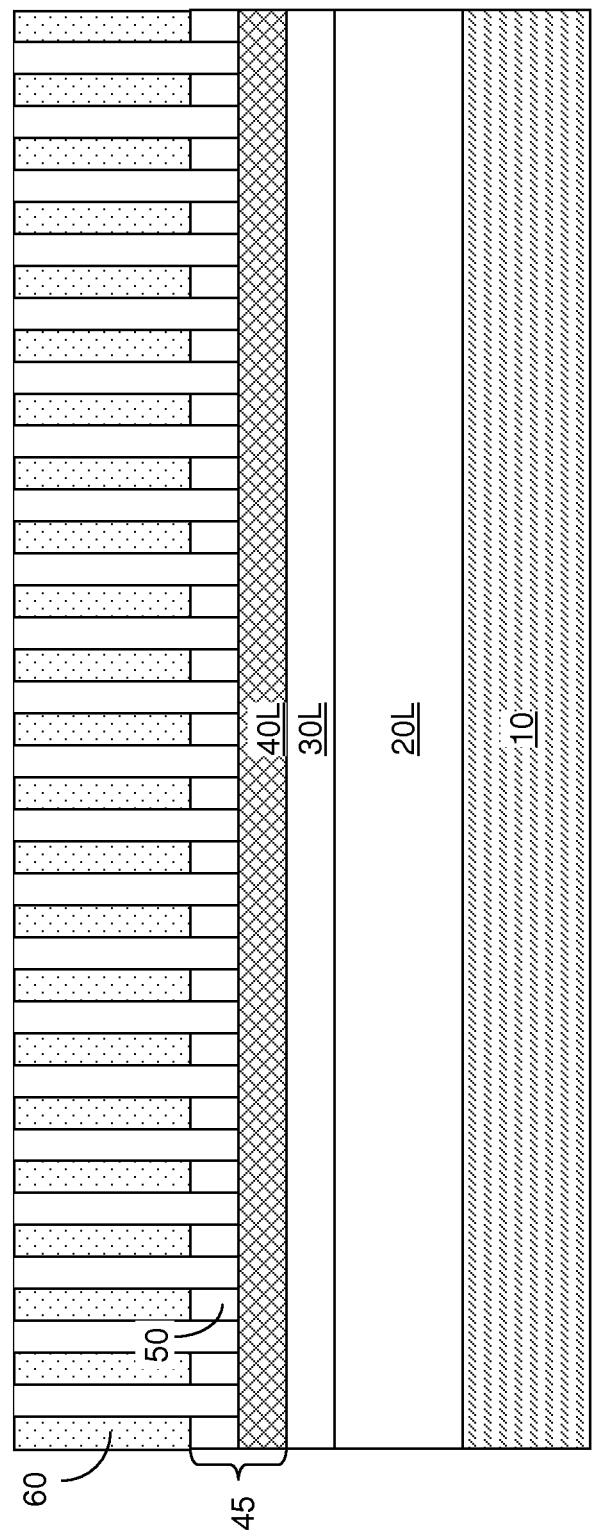
FIG. 7 is a vertical cross-sectional view of the first exemplary structure after transfer of the first pattern into the metallic mask layer according to the first embodiment of the present disclosure.

Referring to FIG. 7, the first pattern into at least an upper portion of the at least one mask layer 45L by an anisotropic etch. The patterned first ARC layer 62 can be employed as the etch mask during the anisotropic etch. The first pattern is formed in one of the at least one mask layer 45L. A patterned mask layer including the first pattern is thus formed. If the at least one mask layer 45L includes a stack of multiple mask layers, the patterned mask layer can be a patterned layer formed from the topmost layer among the multiple mask layers. If the at least one mask layer 45L includes a single mask layer, the patterned mask layer is a patterned layer of the single mask layer. The patterned first ARC layer 62 can be consumed during the anisotropic etch, or can be removed after the anisotropic etch. If the patterned first ARC layer 62 is consumed before the anisotropic etch is completed, the patterned first OPL 60 can be employed as the etch mask during the remainder of the anisotropic etch. At least partially patterned mask layer 45 is thus formed.

For example, if the at least one mask layer 45L includes a vertical stack, from bottom to top, of the dielectric mask layer 40L and the metallic mask layer 50L, the first pattern is transferred into the metallic mask layer 50L. The patterned mask layer is a patterned metallic mask layer 50 in this case. The at least partially patterned mask layer 45 includes a stack, from bottom to top, of the dielectric mask layer 40L and the patterned metallic mask layer 50.

If the at least one mask layer 45L includes a vertical stack, from bottom to top, of a metallic mask layer 50L and a dielectric mask layer 40L, the first pattern is transferred into the dielectric mask layer 40L. The patterned mask layer is a patterned dielectric mask layer (not shown) in this case. The at least partially patterned mask layer 45 includes a stack, from bottom to top, of the metallic mask layer 50L and the patterned dielectric mask layer.

If the at least one mask layer 45L includes a single metallic mask layer 50L, the first pattern is transferred into the metallic mask layer 50L. The patterned mask layer is a patterned metallic mask layer 50 in this case. The at least partially patterned mask layer 45 consists of the patterned metallic mask layer 50.

If the at least one mask layer 45L includes a single dielectric mask layer 40L, the first pattern is transferred into the dielectric mask layer 40L. The patterned mask layer is a patterned dielectric mask layer in this case. The at least partially patterned mask layer 45 consists of the patterned dielectric mask layer.

The anisotropic etch can be a reactive ion etch employing a plasma of at least one fluorocarbon gas such as $CF_4$, $CHF_3$, and $C_4F_8$. Argon or nitrogen can also be added to the plasma. In general, the chemistry of the anisotropic etch for etching the metallic mask layer 50L is selected to simultaneously etch the material of the metallic mask layer 50L and the patterned first ARC layer 62. Thus, the pattern in the first OPL 60 is transferred into the metallic mask layer 50L to form a pattern of trenches therein, and the top surface of the dielectric mask layer 40L is exposed at the bottom of the trenches.

Because the at least one mask layer 45L does not include any organic material and includes only non-organic material(s), line edge roughness and line width roughness in the transferred first pattern in the at least partially patterned mask layer 45 is significantly reduced relative to any process that transfers a similar pattern into an organic material layer such as an amorphous carbon layer.

Figure 8:
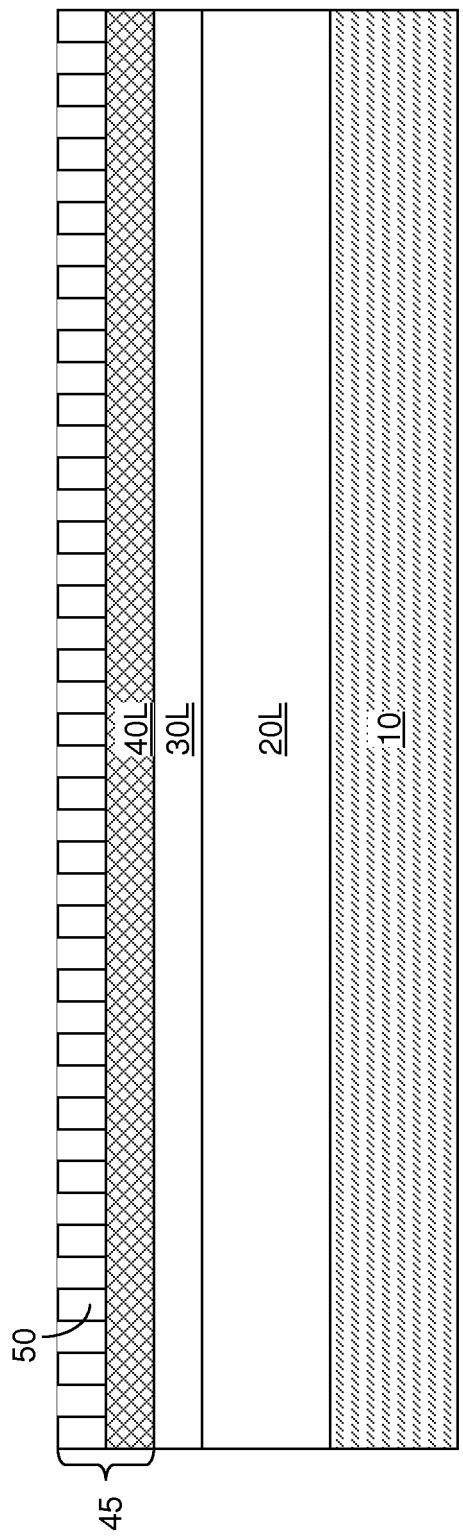
FIG. 8 is a vertical cross-sectional view of the first exemplary structure after removal of the first OPL according to the first embodiment of the present disclosure.

Referring to FIG. 8, the patterned first OPL 60 is removed selective to the patterned mask layer, e.g., the patterned metallic mask layer 50. The patterned first OPL 60 can be removed selective to the patterned metallic mask layer 50 and the dielectric mask layer 40L, for example, by ashing.

Figure 9:
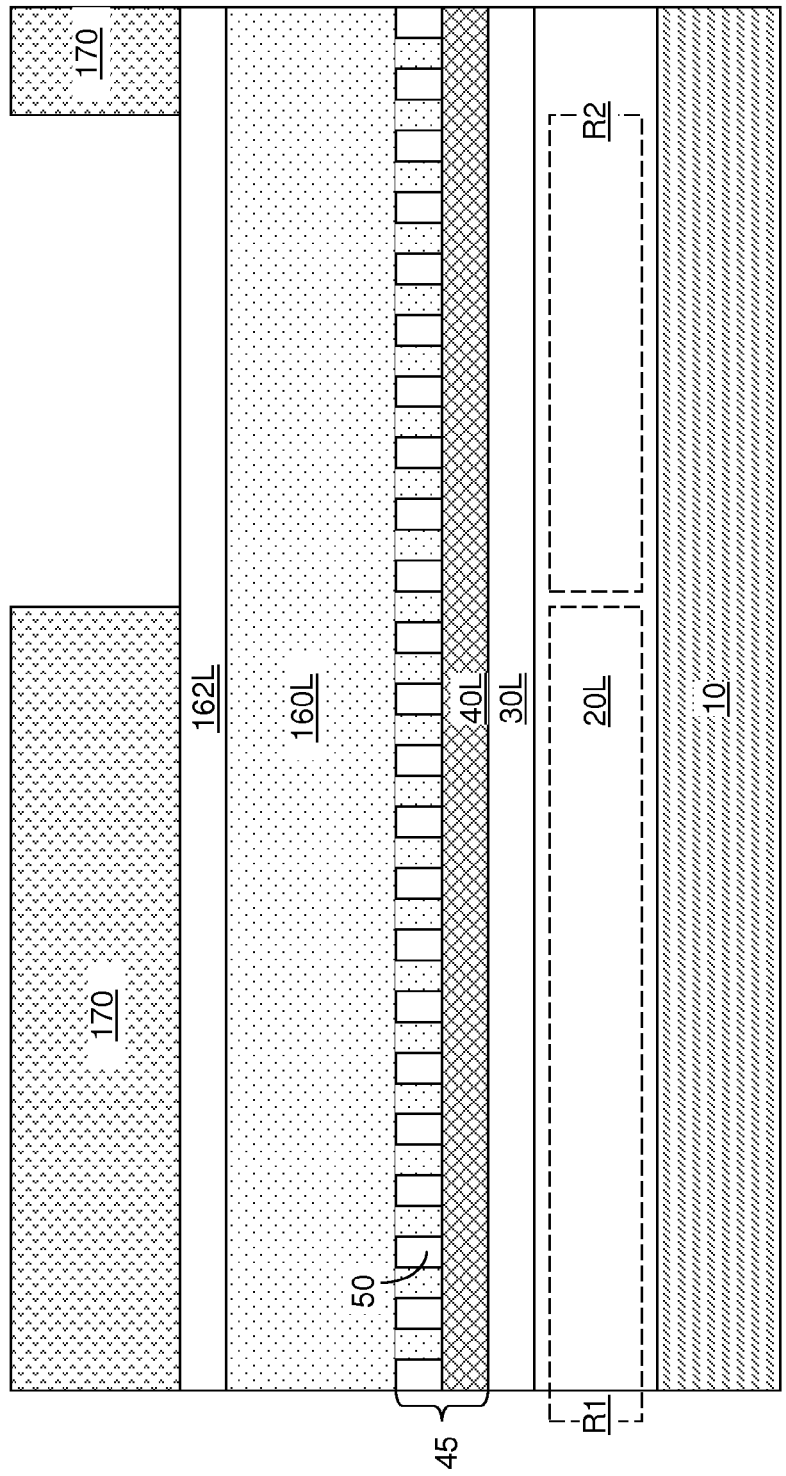
FIG. 9 is a vertical cross-sectional view of the first exemplary structure after application of a second OPL, a second ARC layer, and a first photoresist layer, and lithographic patterning of the first photoresist layer with a second pattern according to the first embodiment of the present disclosure.

Referring to FIG. 9, a second OPL 160L, a second ARC layer 162L, and a first photoresist layer 170 are sequentially applied over the patterned mask layer, e.g., the patterned metallic mask layer 50. The first photoresist layer 170 is lithographically patterned with a second pattern. The second pattern includes at least one blocking area, which is the area of the remaining portions of the first photoresist layer 170 after lithographic exposure and development. At least one opening is formed within the first photoresist layer. The area of the at least one opening is the complement of the at least one blocking area.

The at least one blocking area has lithographic dimensions, i.e., dimensions that are not less than the minimum lithographic dimension. In one embodiment, the first photoresist layer 170 can include a mid-ultraviolet (MUV) photoresist material or a deep-ultraviolet (DUV) photoresist material.

The first exemplary structure illustrated in FIG. 9 is a lithographic structure that includes: the underlying material layer 20L located on the substrate 10; a patterned mask layer including at least one of a dielectric material and a metallic material and located over the underlying material layer 20L; the second OPL 160L located over the patterned mask layer; the second ARC layer 162L located on the second OPL 160L; and the first photoresist layer 170 located over the second ARC layer 162L and including at least one opening therein.

In one embodiment, the patterned mask layer can be the patterned metallic mask layer 50, and a dielectric mask layer 40L can be present underneath the patterned metallic mask layer 50. The dielectric mask layer 40L can be located over the underlying material layer 20L, and the patterned mask layer includes a metallic material, and is located on a top surface of the dielectric mask layer 40L.

In another embodiment, the patterned mask layer can be a patterned dielectric mask layer (not shown), and a metallic mask layer can be present underneath the patterned dielectric mask layer. The metallic mask layer can be located over the underlying material layer 20L. The patterned mask layer includes a dielectric material, and is located on a top surface of the metallic mask layer.

In yet another embodiment, the patterned mask layer can be a patterned metallic mask layer 50 that is in direct contact with the optional dielectric material layer 30L or the underlying material layer 20L. In still another embodiment, the patterned mask layer can be a patterned dielectric mask layer that is in direct contact with the optional dielectric material layer 30L or the underlying material layer 20L.

In one embodiment, the patterned mask layer such as the patterned metallic mask layer 50 can include a periodic pattern of a plurality of parallel line structures that are laterally spaced from one another, i.e., the plurality of portions of the metallic material that constitute the patterned metallic mask layer 50. In one embodiment, the periodic pattern can have a lithographic minimum pitch. In another embodiment, the periodic pattern can have a sublithographic pitch.

In one embodiment, the underlying material layer 20L can include a conductive material layer, and the optional dielectric material layer 30L can have a different composition than the patterned mask layer. The conductive material layer can include at least one of a doped polycrystalline semiconductor material and a metal layer, and the optional dielectric material layer 30L can include silicon nitride.

An overlying structure including the second pattern (e.g., the first photoresist layer 170) is present over the patterned mask layer, e.g., the patterned metallic mask layer 50. The second pattern includes the at least one blocking area.

Figure 10:
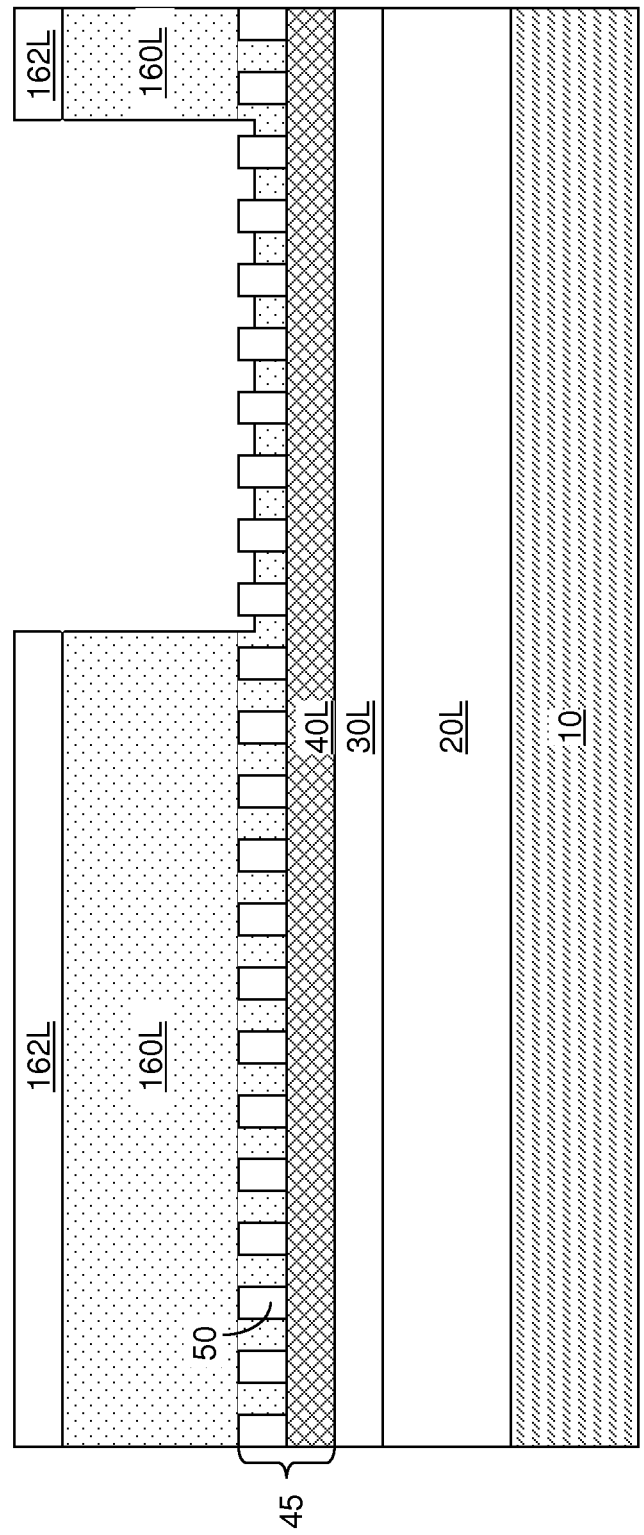
FIG. 10 is a vertical cross-sectional view of the first exemplary structure after transferring the second pattern down to an upper portion of the second OPL according to the first embodiment of the present disclosure.

Referring to FIG. 10, the second pattern is transferred down to an upper portion of the second OPL 160L. The second ARC layer 162L and an upper portion of the second OPL 160L are etched in an anisotropic etch that employs the first photoresist layer 170 as an etch mask. The first photoresist layer 170 can be consumed during the etching of the second OPL 160L.

An overlying structure including the second pattern (e.g., the stack of the upper portion of the second OPL 160L and the second ARC layer 162L) is present over the patterned mask layer, e.g., the patterned metallic mask layer 50.

Figure 11:
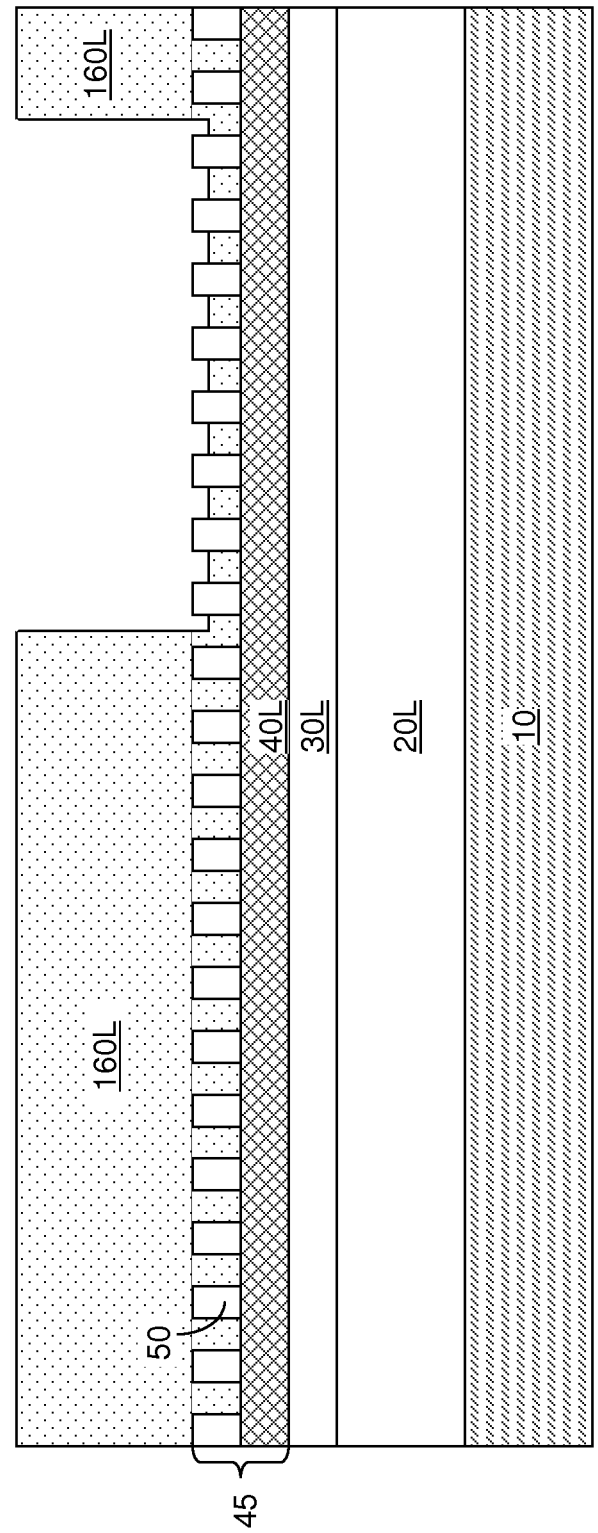
FIG. 11 is a vertical cross-sectional view of the first exemplary structure after removal of the second ARC layer according to the first embodiment of the present disclosure.

Referring to FIG. 11, the second ARC layer 162L can be removed during the etching of the second OPL 160L or in a separate etch step.

Figure 12:
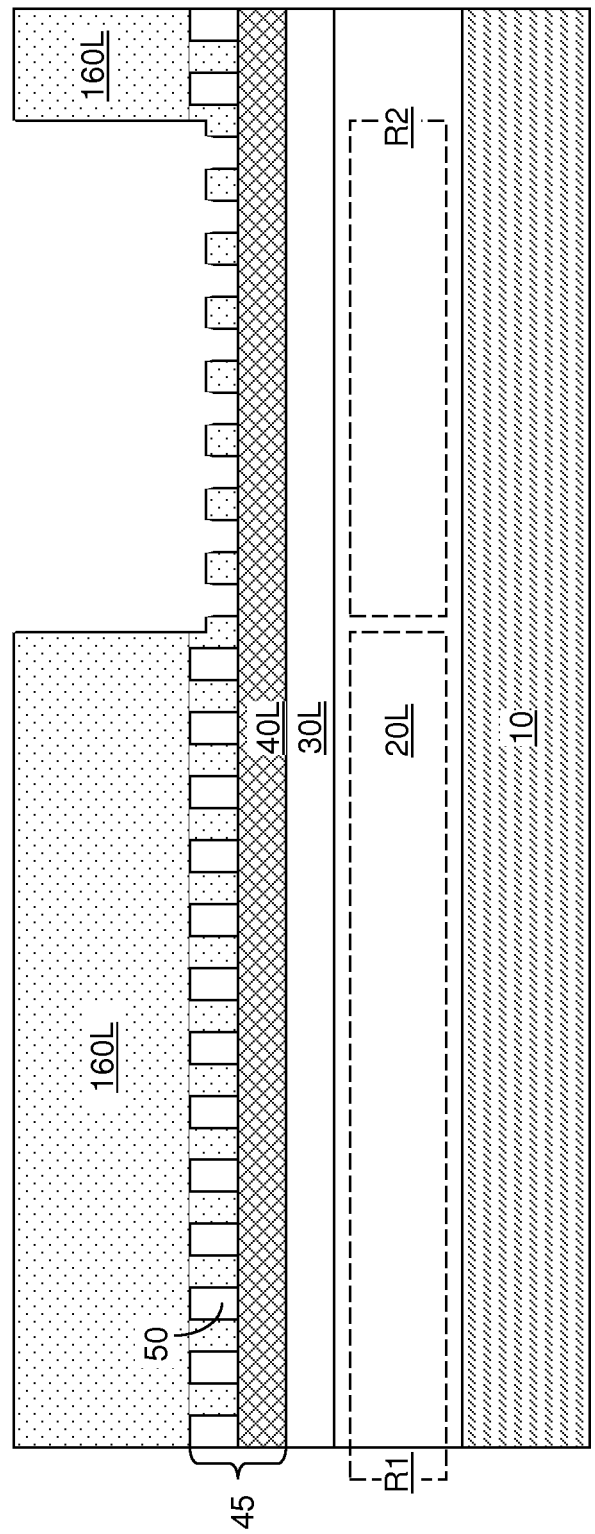
FIG. 12 is a vertical cross-sectional view of the first exemplary structure after removal of physically exposed portions of the metallic mask layer according to the first embodiment of the present disclosure.

Referring to FIG. 12, physically exposed portions of the patterned mask layer, e.g., the patterned metallic mask layer 50, can be removed selective to the material of the layer contacting the bottom surface of the patterned mask layer, e.g., the dielectric mask layer 40L. The portions of the patterned mask layer that do not underlie the blocking area are removed by etching the portions of the patterned mask layer from within an area of the at least one opening, i.e., within the area of the second region R2, which is the area of the complement of the second pattern. The remaining portions of the patterned mask layer include a composite pattern that is an intersection of the first pattern and the second pattern.

Figure 13:
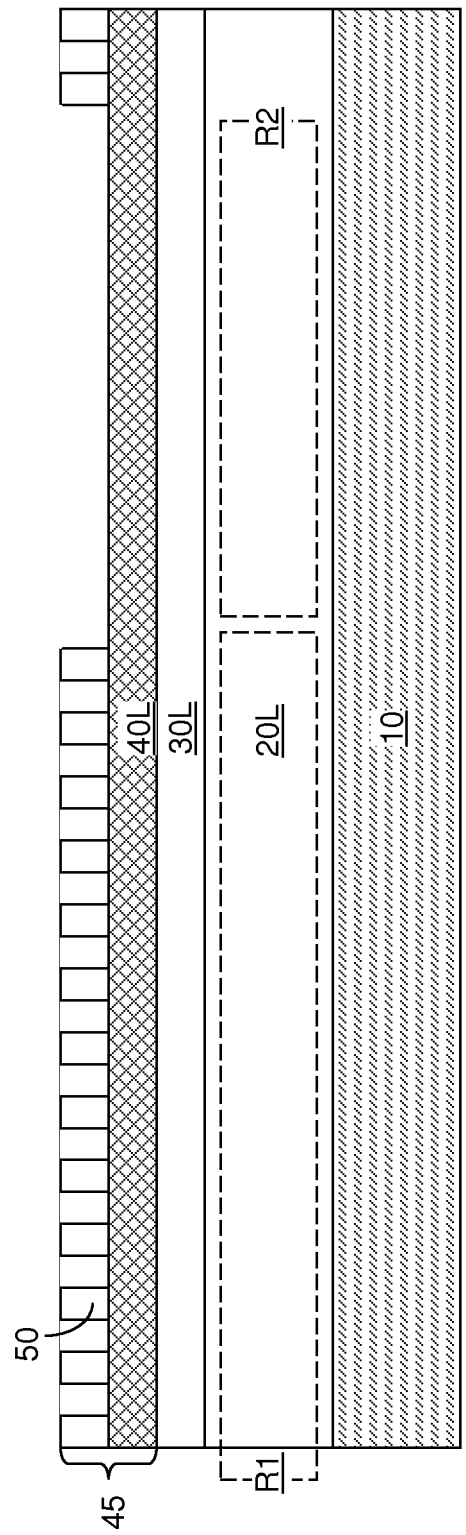
FIG. 13 is a vertical cross-sectional view of the first exemplary structure after removal of the second OPL according to the first embodiment of the present disclosure.

Referring to FIG. 13, the second OPL 160L can be removed, for example, by ashing. The remaining portions of the second OPL 160L can be removed selective to the remaining portions of the patterned mask layer.

The patterned mask layer can include a plurality of patterned mask portions that is present over a first region R1 of the underlying material layer 20L, and the patterned mask layer is not present over a second region R2 of the underlying material layer. The plurality of patterned mask portions can be a periodic array of parallel line structures having a pitch that is not greater than a minimum lithographic pitch. In one embodiment, the second region R2 can have a width that is greater than twice the pitch p (See FIG. 3).

Because the at least partially patterned mask layer 45 does not include any organic material and includes only non-organic material(s), the line edge roughness or line width roughness of the sidewalls of the at least partially patterned mask layer 45 does not increase during the removal of the second OPL 160L.

Figure 14:
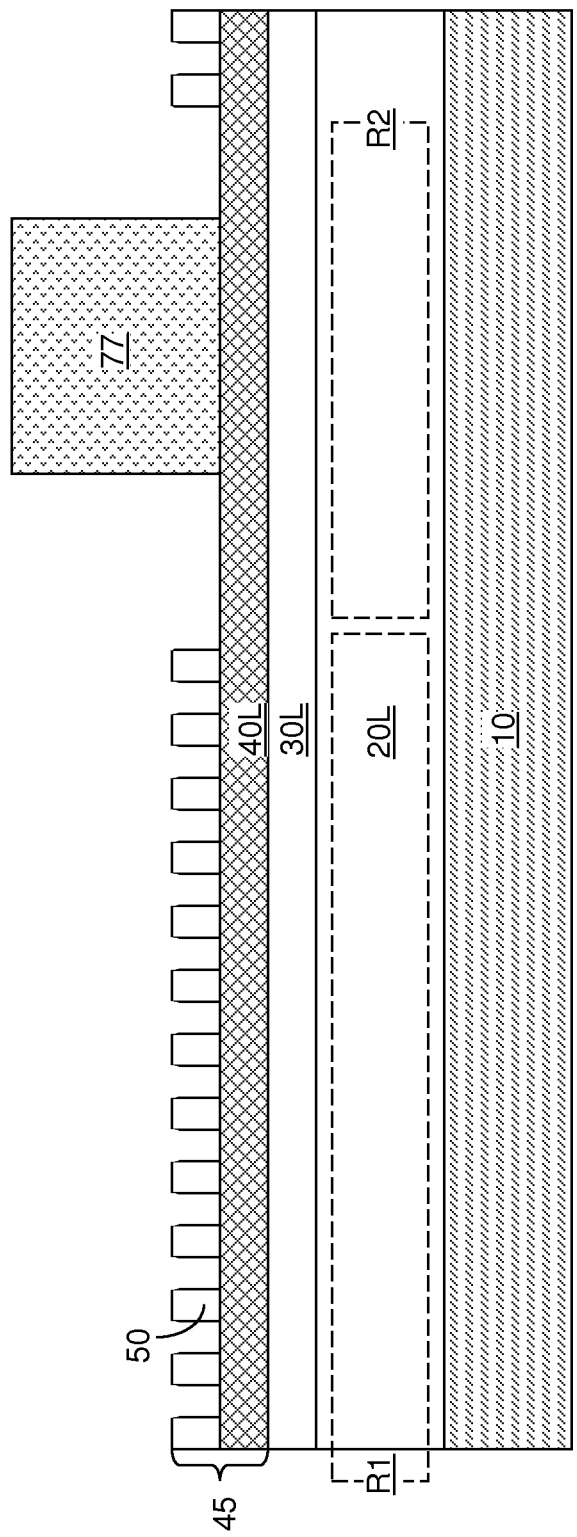
FIG. 14 is a vertical cross-sectional view of the first exemplary structure application of a second photoresist layer and lithographic patterning of the second photoresist layer with a third pattern according to the first embodiment of the present disclosure.

Referring to FIG. 14, a second photoresist layer can be optionally applied over the remaining portions of the patterned mask layer, e.g., the patterned metallic mask layer 50. The second photoresist layer can be applied, for example, by spin coating. The second photoresist layer can be lithographically patterned by lithographic exposure and development to form at least one photoresist block portion 77 having an additional pattern, which is herein referred to as a third pattern.

The third pattern can be any lithographic pattern. The third pattern is present in the area of the at least one photoresist block portion 77. In one embodiment, the third pattern can be present within the area of the second region R2. In one embodiment, the third pattern can define regions having a lateral dimension greater than the pitch p (See FIG. 3).

In one embodiment, a trilayer material stack including an organic planarizing layer, a silicon-containing anti-reflective coating (ARC) layer, and a photoresist layer can be employed instead of the second photoresist layer. The organic planarizing layer can include the same material as the first OPL 60 or as the second OPL 160, and can be deposited such that a planar topmost surface of the organic planarizing layer is formed above the topmost surfaces of the patterned metallic mask layer 50. The silicon-containing ARC layer can include any silicon-containing ARC material known in the art. The photoresist layer can be patterned with the third pattern. After lithographic exposure and development of the photoresist layer, physically exposed portions of the silicon-containing ARC layer can be removed by an etch employing the remaining portions of the photoresist layer as an etch mask. Subsequently, physically exposed portions of the organic planarizing layer are removed by another etch, which can employ remaining portions of the photoresist layer and/or the silicon-containing ARC layer as an etch mask. At least one organic planarizing material portion (and optionally at least one silicon-containing ARC material portion overlying the at least one organic planarizing material portion) can be present in the area of the at least one photoresist block portion 77, and subsequently serve the function of the at least one photoresist block portion 77 in this embodiment.

Figure 15:
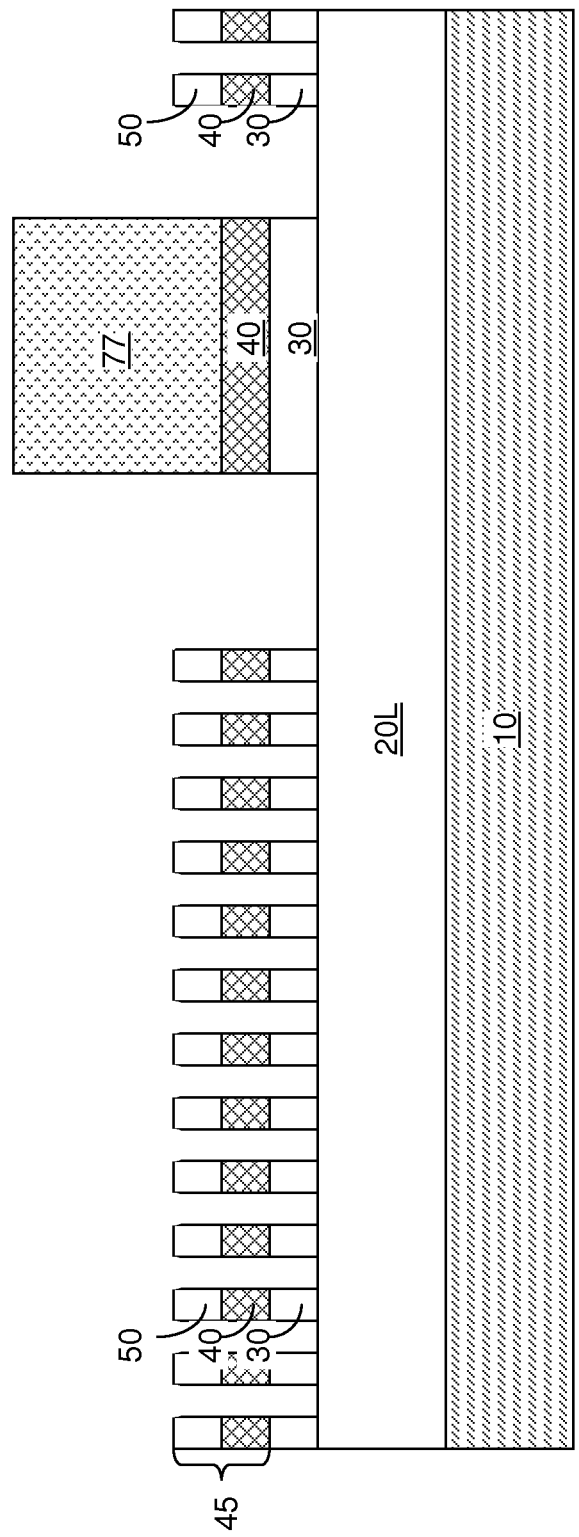
FIG. 15 is a vertical cross-sectional view of the first exemplary structure after transfer of a derived pattern which is a union of the third pattern and a composite pattern that is an intersection of the first pattern and the second pattern into the dielectric mask layer and the optional dielectric material layer according to the first embodiment of the present disclosure.

Referring to FIG. 15, a pattern derived from the composite pattern of the intersection of the first pattern and the second pattern and from the third pattern is transferred into the rest of the at least partially patterned mask layer 45 and the optional dielectric material layer 30L. The derived pattern can be a union of the third pattern and a composite pattern that is the intersection of the first pattern and the second pattern. For example, the derived pattern can be transferred into the dielectric mask layer 40L and the optional dielectric material layer 30L. The remaining portions of the dielectric mask layer 40L constitute a patterned dielectric mask layer 40, and the remaining portions of the optional dielectric material layer 30L constitute an optional patterned dielectric material layer.

Because the at least partially patterned mask layer 45 does not include any organic material and includes only non-organic material(s), the line edge roughness or line width roughness of the sidewalls of the at least partially patterned mask layer 45 does not increase significantly during the pattern transfer etch that transfers the derived pattern into the optional dielectric material layer 30L.

Figure 16:
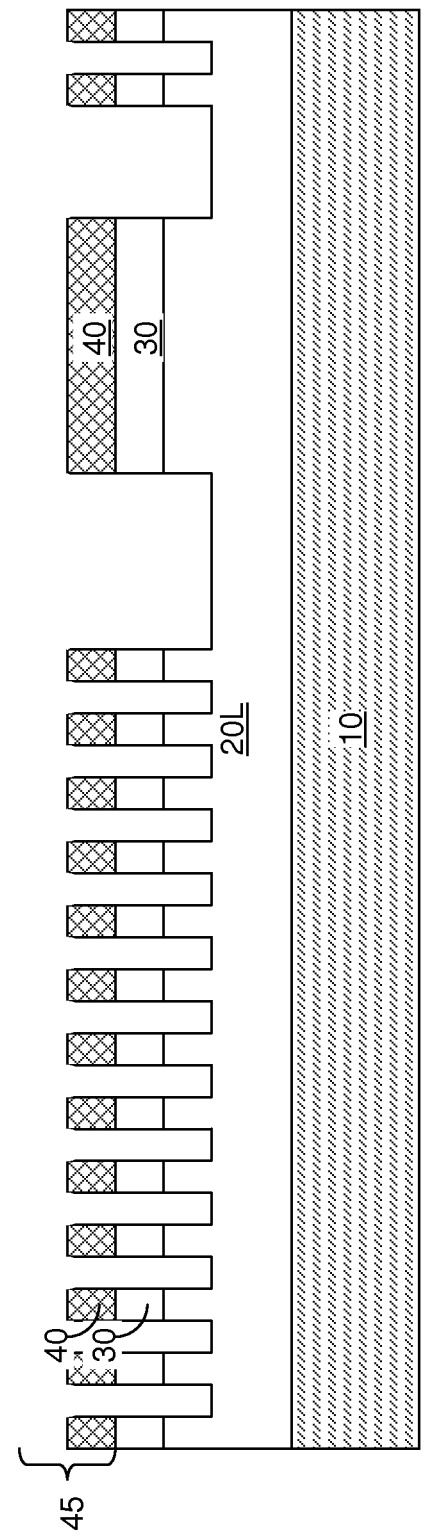
FIG. 16 is a vertical cross-sectional view of the first exemplary structure after transfer of the derived pattern into an upper portion of the underlying material layer and removal of the metallic mask layer according to the first embodiment of the present disclosure.

Referring to FIG. 16, the derived pattern is transferred into an upper portion of the underlying material layer 20L. The transfer of the derived pattern into the underlying material layer 20 can be effected by etching the underlying material layer 20L employing the remaining portions of the patterned mask layer, e.g., the patterned metallic material layer 50, and the at least one photoresist block portion 77 as an etch mask.

Optionally, the patterned mask layer, e.g., the patterned metallic mask layer 50, can be removed once the derived pattern is transferred into any layer between the patterned mask layer and the underlying material layer 20L. For example, the patterned metallic mask layer 50 can be removed after the derived pattern is transferred into the patterned dielectric mask layer 40 and/or the optional patterned dielectric material layer 30.

In one embodiment, the patterned mask layer, e.g., the patterned metallic mask layer 50, can be consumed during the anisotropic etch that transfers the derived pattern into the dielectric mask layer 40L, the optional dielectric material layer 30L, and/or the underlying material layer 20L. In another embodiment, the removal of the patterned mask layer, e.g., the patterned metallic mask layer 50, can be performed by an etch process that removes the material of the patterned mask layer selective to physically exposed material underneath the patterned mask layer. In one embodiment, the remaining portions of the patterned mask layer, e.g., the patterned metallic mask layer 50, can be removed selective to the underlying material layer 20L after the transfer of the derived pattern. The at least one photoresist block portion 77 can be consumed during the transfer of the derived pattern, or alternately, can be removed, for example, by ashing.

Figure 17:
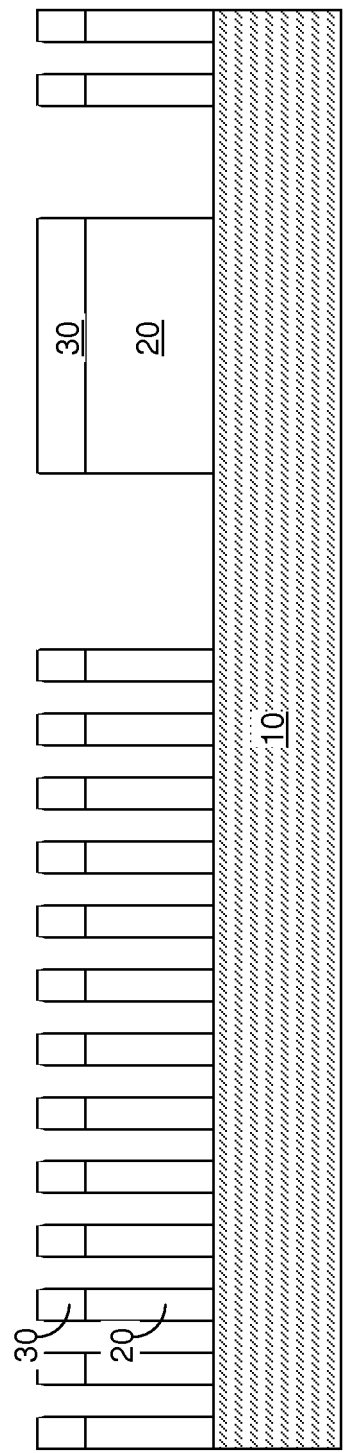
FIG. 17 is a vertical cross-sectional view of the first exemplary structure after transfer of the derived pattern to the bottom of the underlying material layer and removal of the dielectric mask layer according to the first embodiment of the present disclosure.

Referring to FIG. 17, the derived pattern is transferred to the bottom of the underlying material layer 20L. All materials of the at least one mask layer 45L are removed. For example, the patterned dielectric mask layer 40 is removed selective to the materials of the optional patterned dielectric material layer 30 and the patterned underlying material layer 20.

Figure 18:
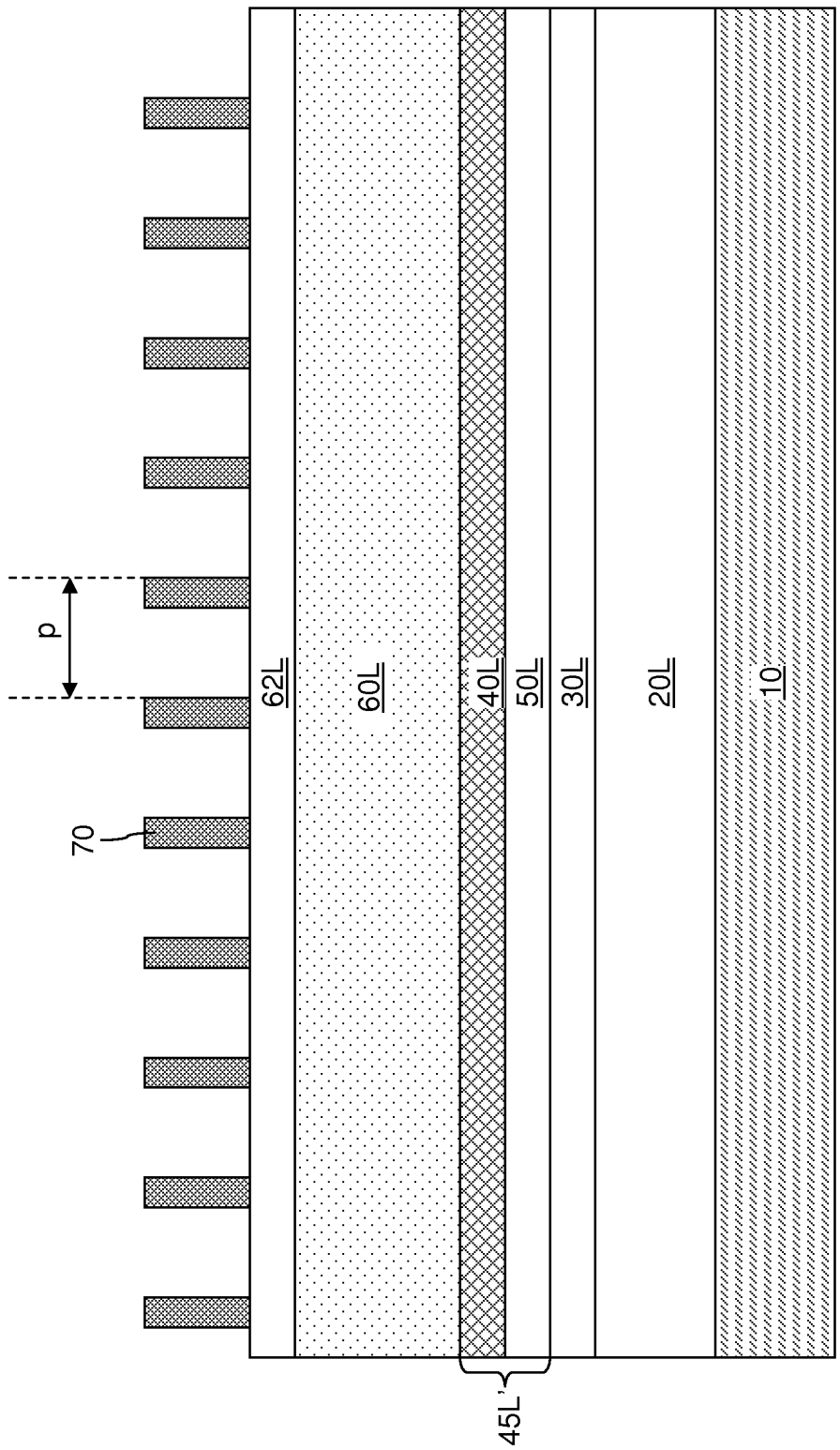
FIG. 18 is a vertical cross-sectional view of a second exemplary structure after deposition of an underlying material layer, and optional dielectric material layer, a metallic mask layer, a dielectric mask layer, a first organic planarizing layer (OPL), a first antireflective coating (ARC) layer, and mandrel structures according to a second embodiment of the present disclosure.

Referring to FIG. 18, a second exemplary structure according to a second embodiment of the present disclosure is derived from the first exemplary structure of FIG. 1 by altering the at least one mask layer 45L. Specifically, a vertical stack, from bottom to top, of the metallic mask layer 50L and the dielectric mask layer 40L is employed for the at least one mask layer 45L. The metallic mask layer 50L of the second embodiment can have the same composition and thickness as in the first embodiment, and can be formed by the same method as in the first embodiment. The dielectric mask layer 40L of the second embodiment can have the same composition and thickness as in the first embodiment, and can be formed by the same method as in the first embodiment.

Figure 19:
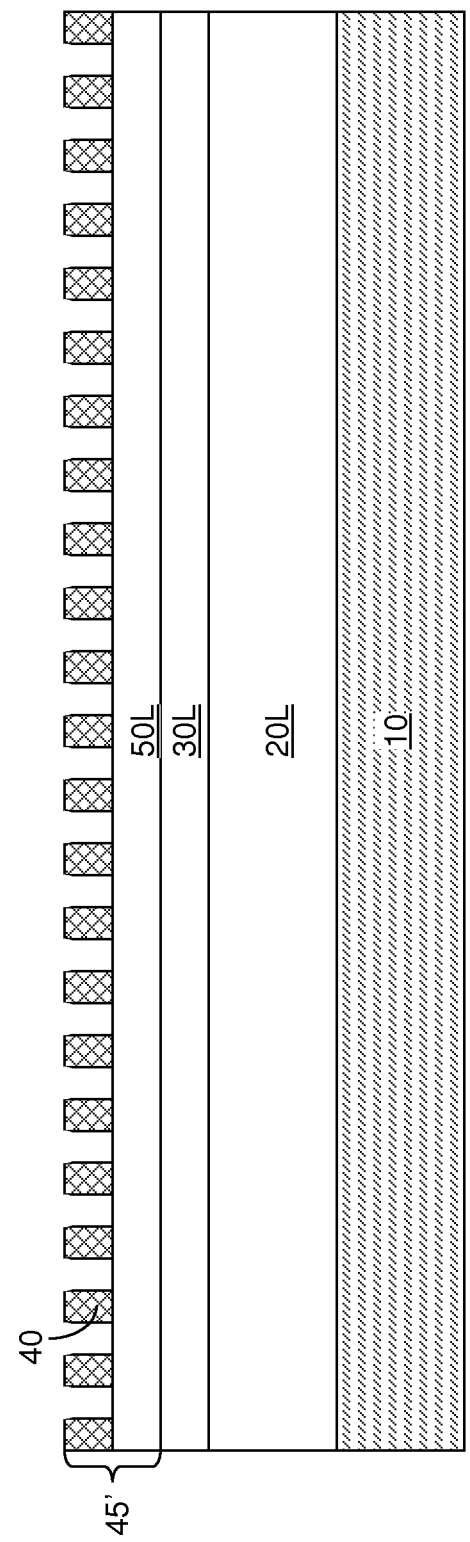
FIG. 19 is a vertical cross-sectional view of the second exemplary structure after transfer of the first pattern into the dielectric mask layer according to the second embodiment of the present disclosure.

Referring to FIG. 19, the processing steps of FIGS. 2-6 can be performed. Subsequently, the first pattern into at least an upper portion of the at least one mask layer 45L by an anisotropic etch. The patterned first ARC layer 62 can be employed as the etch mask during the anisotropic etch. The first pattern is formed in one of the at least one mask layer 45L. A patterned mask layer including the first pattern is thus formed. The patterned first ARC layer 62 can be consumed during the anisotropic etch, or can be removed after the anisotropic etch. If the patterned first ARC layer 62 is consumed before the anisotropic etch is completed, the patterned first OPL 60 can be employed as the etch mask during the remainder of the anisotropic etch. At least partially patterned mask layer 45 is thus formed.

In this embodiment, the first pattern is transferred into the dielectric mask layer 40L. The patterned mask layer is a patterned dielectric mask layer 40. The at least partially patterned mask layer 45 includes a stack, from bottom to top, of the metallic mask layer 50L and the patterned dielectric mask layer 45.

The chemistry of the anisotropic etch for etching the dielectric mask layer 40L is selected to simultaneously etch the material of the dielectric mask layer 40L and the patterned first ARC layer 62. Thus, the pattern in the first OPL 60 is transferred into the dielectric mask layer 40L to form a pattern of trenches therein, and the top surface of the metallic mask layer 50L is exposed at the bottom of the trenches.

Subsequently, the patterned first OPL 60 is removed selective to the patterned mask layer, e.g., the patterned dielectric mask layer 40. The patterned first OPL 60 can be removed selective to the patterned dielectric mask layer 40 and the metallic mask layer 50L, for example, by ashing.

Figure 20:
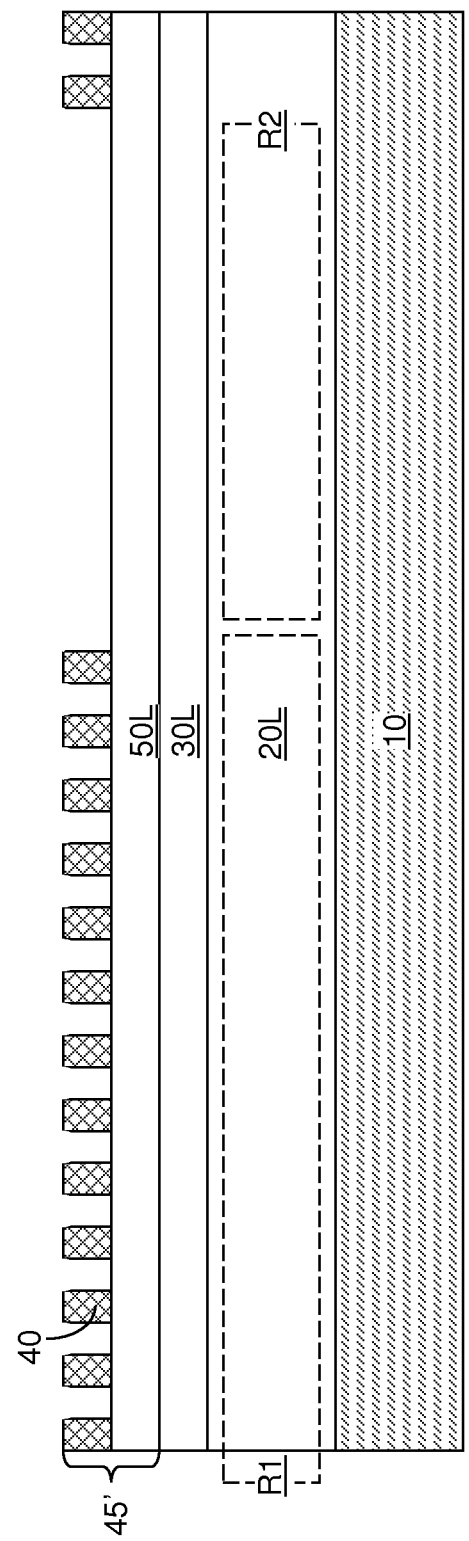
FIG. 20 is a vertical cross-sectional view of the second exemplary structure after transfer of the second pattern into the dielectric mask layer and removal of the second OPL according to the second embodiment of the present disclosure.

Referring to FIG. 20, processing steps of FIGS. 9-11 are performed. Subsequently, physically exposed portions of the patterned mask layer, e.g., the patterned dielectric mask layer 40, can be removed selective to the material of the layer contacting the bottom surface of the patterned mask layer, e.g., the metallic mask layer 50L. The portions of the patterned mask layer that do not underlie the blocking area are removed by etching the portions of the patterned mask layer from within an area of the at least one opening, i.e., within the area of the second region R2, which is the area of the complement of the second pattern. The remaining portions of the patterned mask layer include a composite pattern that is an intersection of the first pattern and the second pattern.

The second OPL 160L can then be removed, for example, by ashing. The remaining portions of the second OPL 160L can be removed selective to the remaining portions of the patterned mask layer.

The patterned mask layer, i.e., the patterned dielectric mask layer 40, can include a plurality of patterned mask portions that is present over a first region R1 of the underlying material layer 20L, and the patterned mask layer is not present over a second region R2 of the underlying material layer. The plurality of patterned mask portions can be a periodic array of parallel line structures having a pitch that is not greater than a minimum lithographic pitch. In one embodiment, the second region R2 can have a width that is greater than twice the pitch p (See FIG. 3).

Figure 21:
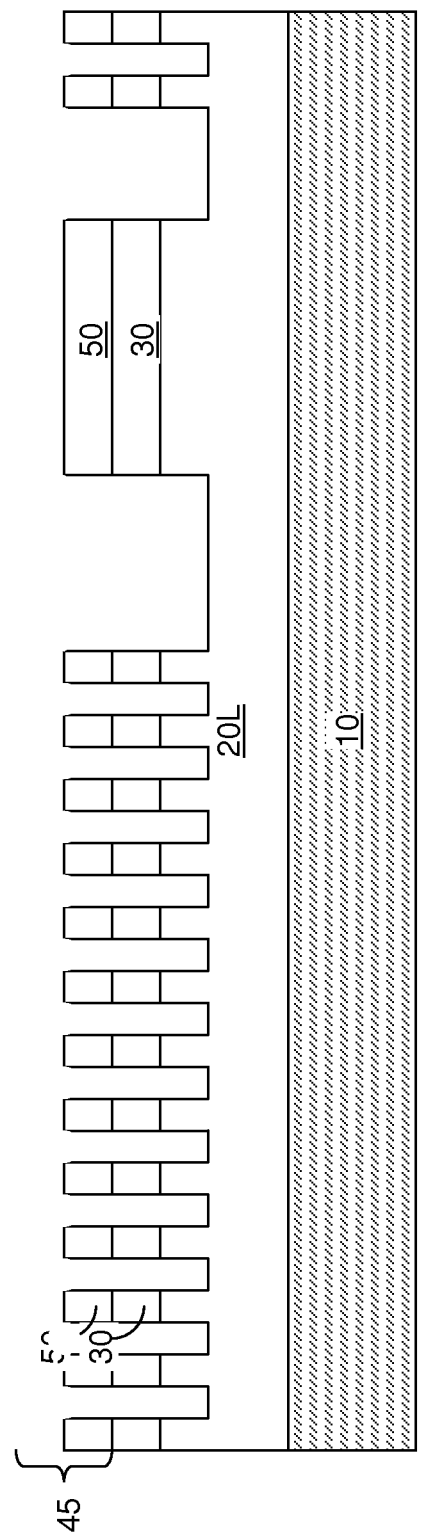
FIG. 21 is a vertical cross-sectional view of the second exemplary structure after transfer of the derived pattern into an upper portion of the underlying material layer and removal of the dielectric mask layer according to the second embodiment of the present disclosure.

Referring to FIG. 21, the processing step of FIG. 14 is performed. Subsequently, a pattern derived from the composite pattern of the intersection of the first pattern and the second pattern and from the third pattern is transferred into the rest of the at least partially patterned mask layer 45 and the optional dielectric material layer 30L. The derived pattern can be a union of the third pattern and a composite pattern that is the intersection of the first pattern and the second pattern. For example, the derived pattern can be transferred into the metallic mask layer 50L and the optional dielectric material layer 30L. The remaining portions of the metallic mask layer 50L constitute a patterned dielectric mask layer 50, and the remaining portions of the optional dielectric material layer 30L constitute an optional patterned dielectric material layer.

Subsequently, the derived pattern is transferred into an upper portion of the underlying material layer 20L. The transfer of the derived pattern into the underlying material layer 20 can be effected by etching the underlying material layer 20L employing the remaining portions of the patterned mask layer, e.g., the patterned dielectric material layer 40, and the at least one photoresist block portion 77 (See FIG. 15) as an etch mask.

Optionally, the patterned mask layer, e.g., the patterned dielectric mask layer 40, can be removed once the derived pattern is transferred into any layer between the patterned mask layer and the underlying material layer 20L. For example, the patterned dielectric mask layer 40 can be removed after the derived pattern is transferred into the patterned metallic mask layer 50 and/or the optional patterned dielectric material layer 30.

In one embodiment, the patterned mask layer, e.g., the patterned dielectric mask layer 40, can be consumed during the anisotropic etch that transfers the derived pattern into the metallic mask layer 50L, the optional dielectric material layer 30L, and/or the underlying material layer 20L. In another embodiment, the removal of the patterned mask layer, e.g., the patterned dielectric mask layer 40, can be performed by an etch process that removes the material of the patterned mask layer selective to physically exposed material underneath the patterned mask layer. In one embodiment, the remaining portions of the patterned mask layer, e.g., the patterned dielectric mask layer 40, can be removed selective to the underlying material layer 20L after the transfer of the derived pattern. The at least one photoresist block portion 77 can be consumed during the transfer of the derived pattern, or alternately, can be removed, for example, by ashing.

The anisotropic etch can be continued to provide the same structure as the first exemplary structure shown in FIG. 17.

Figure 22:
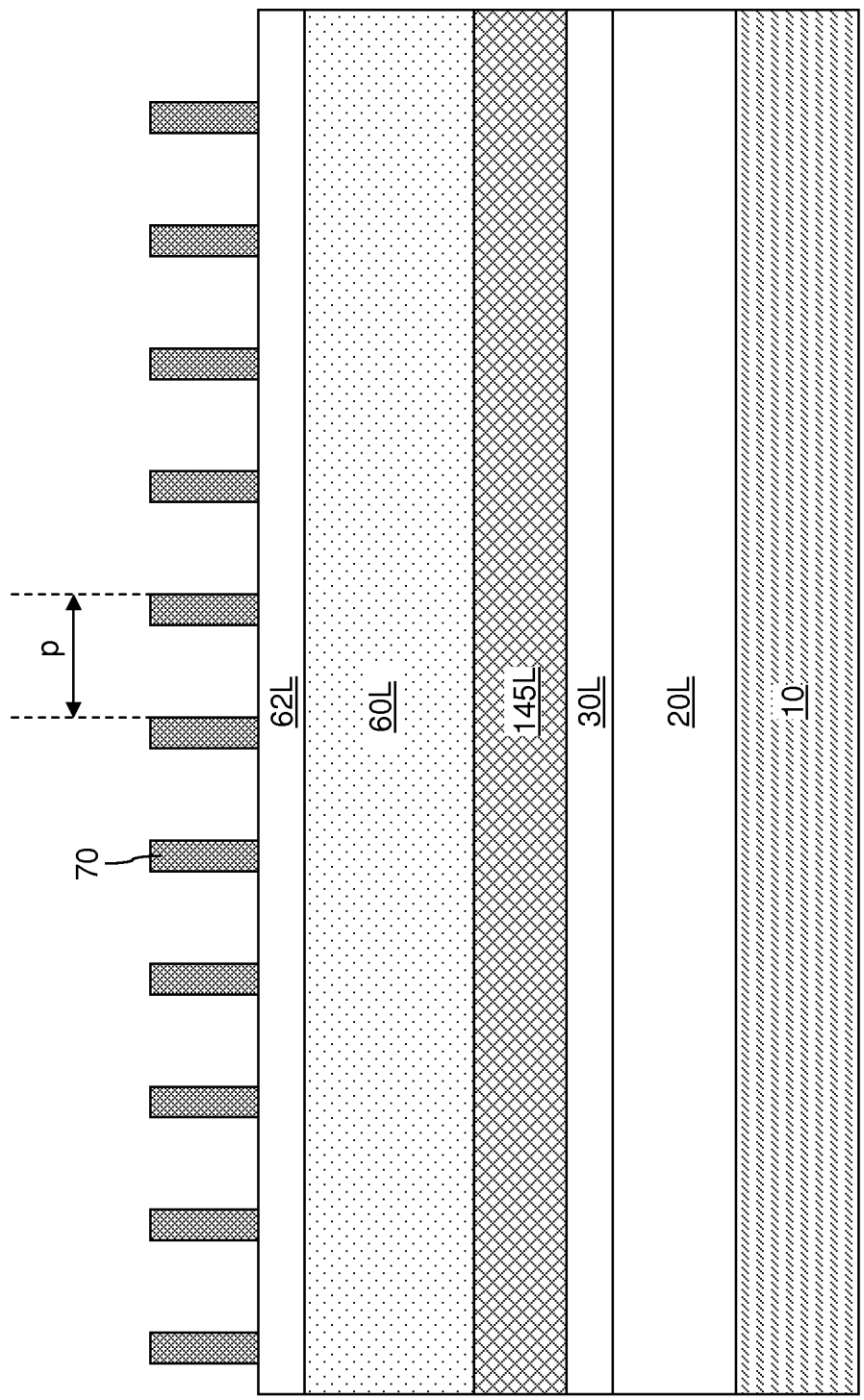
FIG. 22 is a vertical cross-sectional view of a third exemplary structure after deposition of an underlying material layer, and optional dielectric material layer, a mask layer, a first organic planarizing layer (OPL), a first antireflective coating (ARC) layer, and mandrel structures according to a third embodiment of the present disclosure

Referring to FIG. 22, a third exemplary structure according to a third embodiment of the present disclosure is derived from the first exemplary structure of FIG. 1 by altering the at least one mask layer 45L. Specifically, a homogeneous mask layer 145L including a metallic material or a dielectric material can be employed for the at least one mask layer 45L. The homogeneous mask layer 145L can have a same composition throughout. The homogeneous mask layer 145L can have the same composition as the dielectric mask layer 40L of the first embodiment, or as the metallic mask layer 50L of the first embodiment. The thickness of the homogeneous mask layer 145L can be from 30 nm to 600 nm, although lesser and greater thicknesses can also be employed. The homogeneous mask layer 145L can be formed employing methods for forming the dielectric mask layer 40L or employing methods for forming the metallic mask layer 50L.

Figure 23:
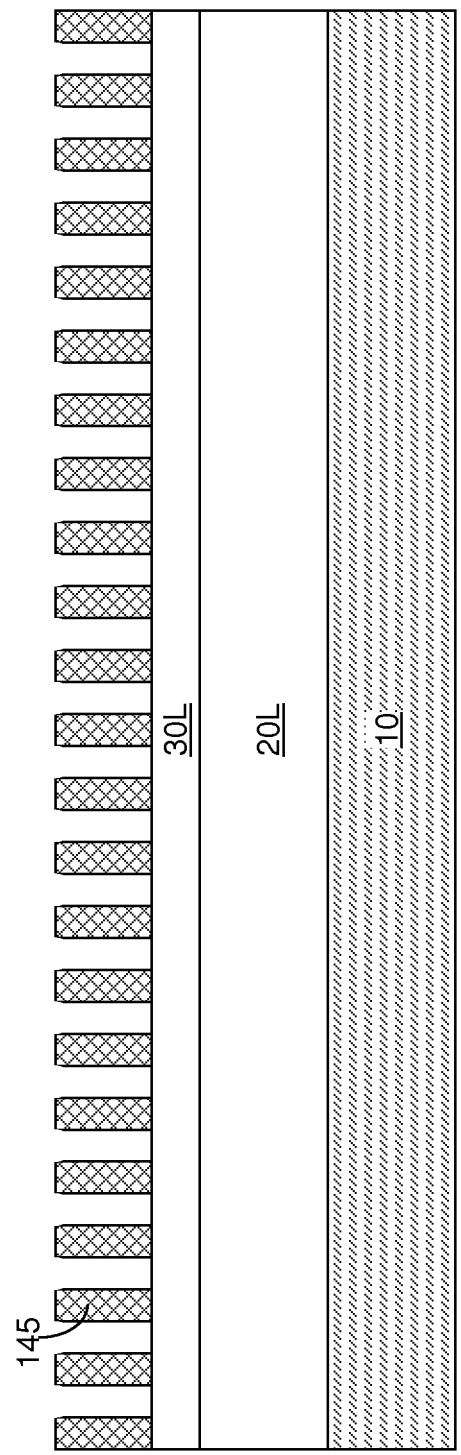
FIG. 23 is a vertical cross-sectional view of the third exemplary structure after transfer of the first pattern into the mask layer according to the third embodiment of the present disclosure.

Referring to FIG. 23, the processing steps of FIGS. 2-6 can be performed. Subsequently, the first pattern into at least an upper portion of the homogeneous mask layer 145L by an anisotropic etch. The patterned first ARC layer 62 can be employed as the etch mask during the anisotropic etch. The first pattern is formed in one of the homogeneous mask layer 145L. A patterned mask layer including the first pattern is thus formed. The patterned first ARC layer 62 can be consumed during the anisotropic etch, or can be removed after the anisotropic etch. If the patterned first ARC layer 62 is consumed before the anisotropic etch is completed, the patterned first OPL 60 can be employed as the etch mask during the remainder of the anisotropic etch. A patterned homogeneous mask layer 145 is thus formed.

In this embodiment, the first pattern is transferred into the homogeneous mask layer 145L. The patterned mask layer is a patterned homogeneous mask layer 145.

The chemistry of the anisotropic etch for etching the dielectric mask layer 40L is selected to simultaneously etch the material of the homogeneous mask layer 145L and the patterned first ARC layer 62. Thus, the pattern in the first OPL 60 is transferred into the homogeneous mask layer 145L to form a pattern of trenches therein, and the top surface of the optional dielectric material layer 30L is exposed at the bottom of the trenches.

Subsequently, the patterned first OPL 60 is removed selective to the patterned mask layer, e.g., the patterned homogeneous mask layer 145. The patterned first OPL 60 can be removed selective to the patterned homogeneous mask layer 145 and the optional dielectric material layer 30L, for example, by ashing.

Figure 24:
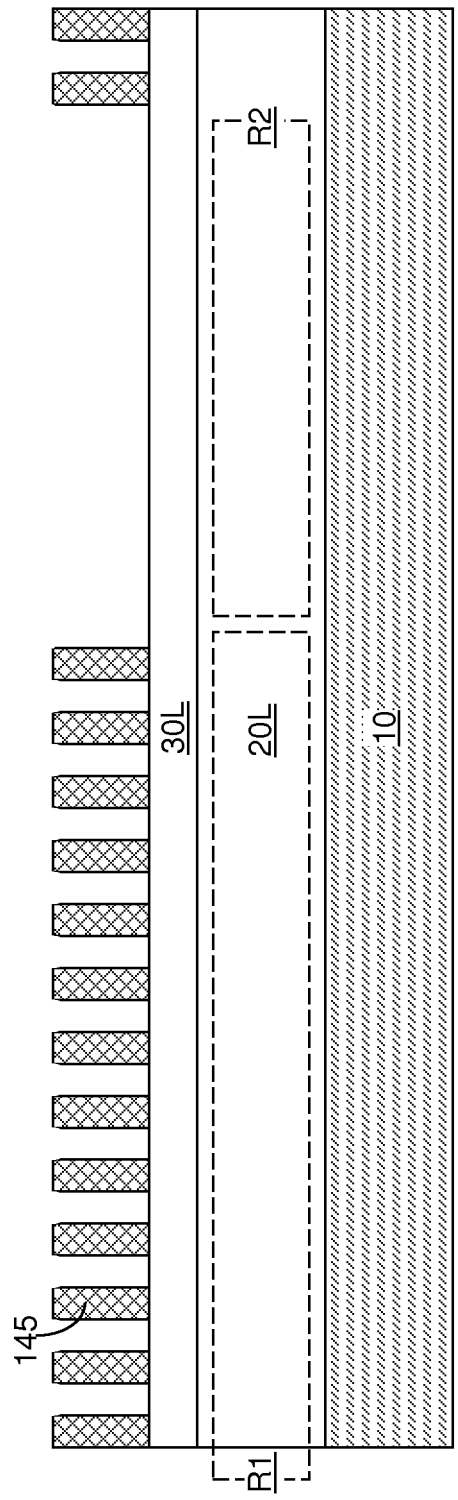
FIG. 24 is a vertical cross-sectional view of the third exemplary structure after transfer of the second pattern into the mask layer and removal of the second OPL according to the third embodiment of the present disclosure.

Referring to FIG. 24, processing steps of FIGS. 9-11 are performed. Subsequently, physically exposed portions of the patterned mask layer, e.g., the patterned homogeneous mask layer 145, can be removed selective to the material of the layer contacting the bottom surface of the patterned mask layer, e.g., the optional dielectric material layer 30L or the underlying material layer 20L. The portions of the patterned mask layer that do not underlie the blocking area are removed by etching the portions of the patterned mask layer from within an area of the at least one opening, i.e., within the area of the second region R2, which is the area of the complement of the second pattern. The remaining portions of the patterned mask layer include a composite pattern that is an intersection of the first pattern and the second pattern.

The second OPL 160L can then be removed, for example, by ashing. The remaining portions of the second OPL 160L can be removed selective to the remaining portions of the patterned mask layer.

The patterned mask layer, i.e., the patterned homogeneous mask layer 145, can include a plurality of patterned mask portions that is present over a first region R1 of the underlying material layer 20L, and the patterned mask layer is not present over a second region R2 of the underlying material layer. The plurality of patterned mask portions can be a periodic array of parallel line structures having a pitch that is not greater than a minimum lithographic pitch. In one embodiment, the second region R2 can have a width that is greater than twice the pitch p (See FIG. 3).

Figure 25:
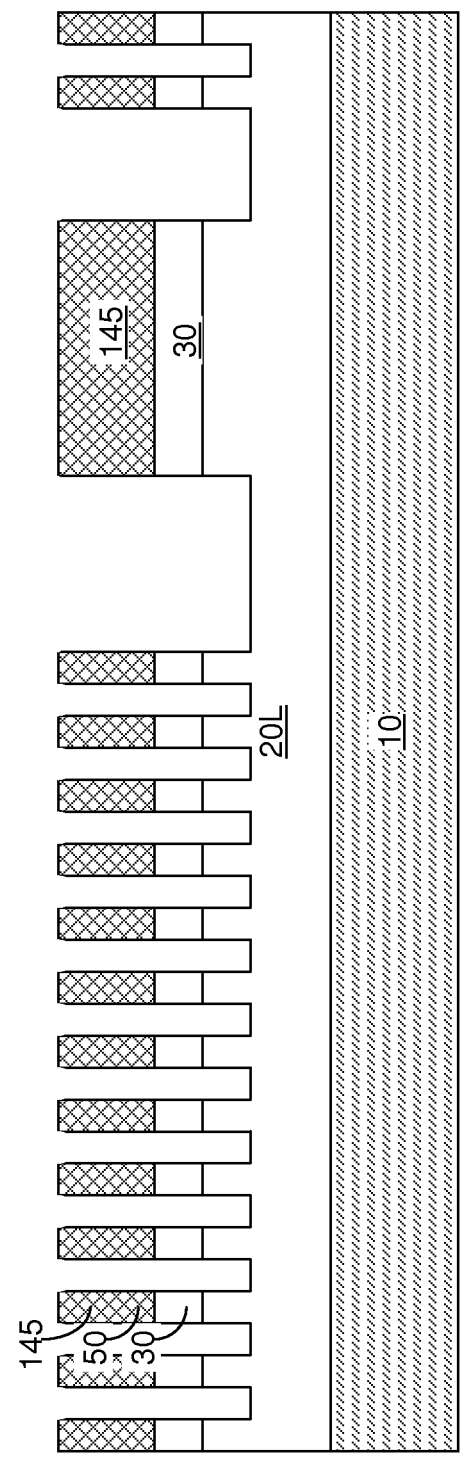
FIG. 25 is a vertical cross-sectional view of the third exemplary structure after transfer of the derived pattern into an upper portion of the underlying material according to the third embodiment of the present disclosure.

Referring to FIG. 25, the processing step of FIG. 14 is performed. Subsequently, a pattern derived from the composite pattern of the intersection of the first pattern and the second pattern and from the third pattern is transferred into the optional dielectric material layer 30L, if present. The derived pattern can be a union of the third pattern and a composite pattern that is the intersection of the first pattern and the second pattern. The remaining portions of the optional dielectric material layer 30L constitute an optional patterned dielectric material layer.

Subsequently, the derived pattern is transferred into an upper portion of the underlying material layer 20L. The transfer of the derived pattern into the underlying material layer 20 can be effected by etching the underlying material layer 20L employing the remaining portions of the patterned mask layer, e.g., the patterned homogeneous mask layer 145, and the at least one photoresist block portion 77 (See FIG. 15) as an etch mask.

Optionally, the patterned mask layer, e.g., the patterned homogeneous mask layer 145, can be removed once the derived pattern is transferred into any layer between the patterned mask layer and the underlying material layer 20L. For example, the patterned homogeneous mask layer 145 can be removed after the derived pattern is transferred into the optional patterned dielectric material layer 30.

In one embodiment, the patterned mask layer, e.g., patterned homogeneous mask layer 145, can be consumed during the anisotropic etch that transfers the derived pattern into the optional dielectric material layer 30L and/or the underlying material layer 20L. In another embodiment, the removal of the patterned mask layer, e.g., the patterned homogeneous mask layer 145, can be performed by an etch process that removes the material of the patterned mask layer selective to physically exposed material underneath the patterned mask layer. In one embodiment, the remaining portions of the patterned mask layer, e.g., the patterned homogeneous mask layer 145, can be removed selective to the underlying material layer 20L after the transfer of the derived pattern. The at least one photoresist block portion 77 can be consumed during the transfer of the derived pattern, or alternately, can be removed, for example, by ashing.

The anisotropic etch can be continued to provide the same structure as the first exemplary structure shown in FIG. 17.

Figure 26:
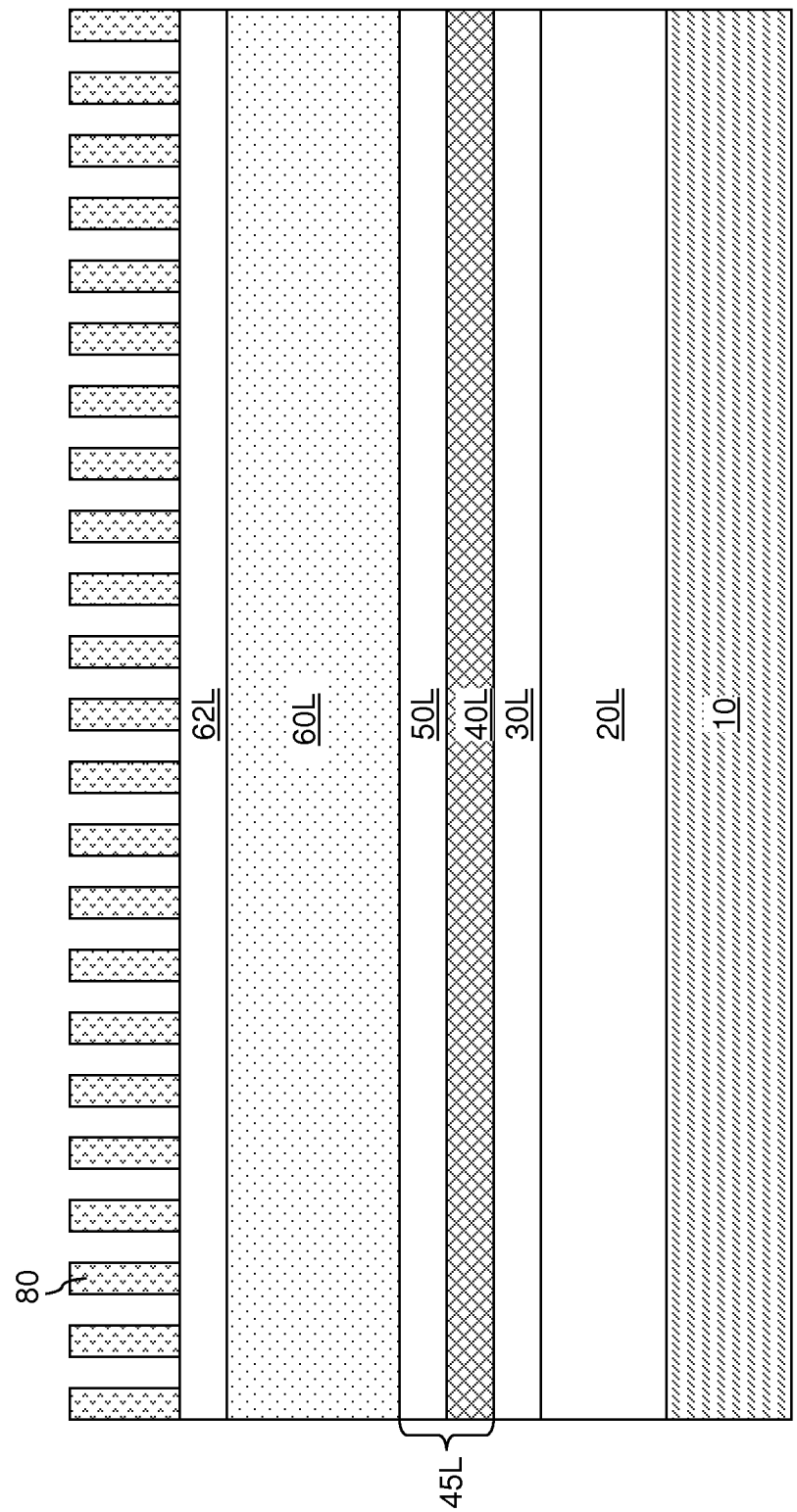
FIG. 26 is a vertical cross-sectional view of a fourth exemplary structure after deposition of an underlying material layer, and optional dielectric material layer, a dielectric mask layer, a metallic mask layer, a first organic planarizing layer (OPL), a first antireflective coating (ARC) layer, and a photoresist layer and lithographic patterning of the photoresist layer according to a fourth embodiment of the present disclosure.

Referring to FIG. 26, a fourth exemplary structure according to a fourth embodiment of the present disclosure can be derived from the first exemplary structure of FIG. 1 by not forming the mandrel structures 70 and by applying and lithographically patterning a photoresist layer to form a patterned photoresist layer 80 including a first pattern. The patterned photoresist layer 80 can include a set of photoresist material portions.

The fourth exemplary structure illustrated in FIG. 26 is a lithographic structure, which includes the underlying material layer 20L located on the substrate 10; at least one mask layer 45L including at least one of a dielectric material and a metallic material and located over the underlying material layer 20L; the first organic planarizing layer (OPL) 60L located over the at least one mask layer 45L; the first antireflective coating (ARC) layer 62L located on the first OPL 60L; and the patterned structure of the patterned photoresist layer 80 located over the first ARC layer 62L.

In one embodiment, the patterned structure has a pattern of a plurality of parallel lines. In one embodiment, the patterned structure includes a set of photoresist material portions having a lithographic minimum pitch. The processing step of FIG. 5 can be subsequently performed employing the patterned photoresist layer 80 as an etch mask. Subsequently, processing steps of FIGS. 6-17 can be performed.

Figure 27:
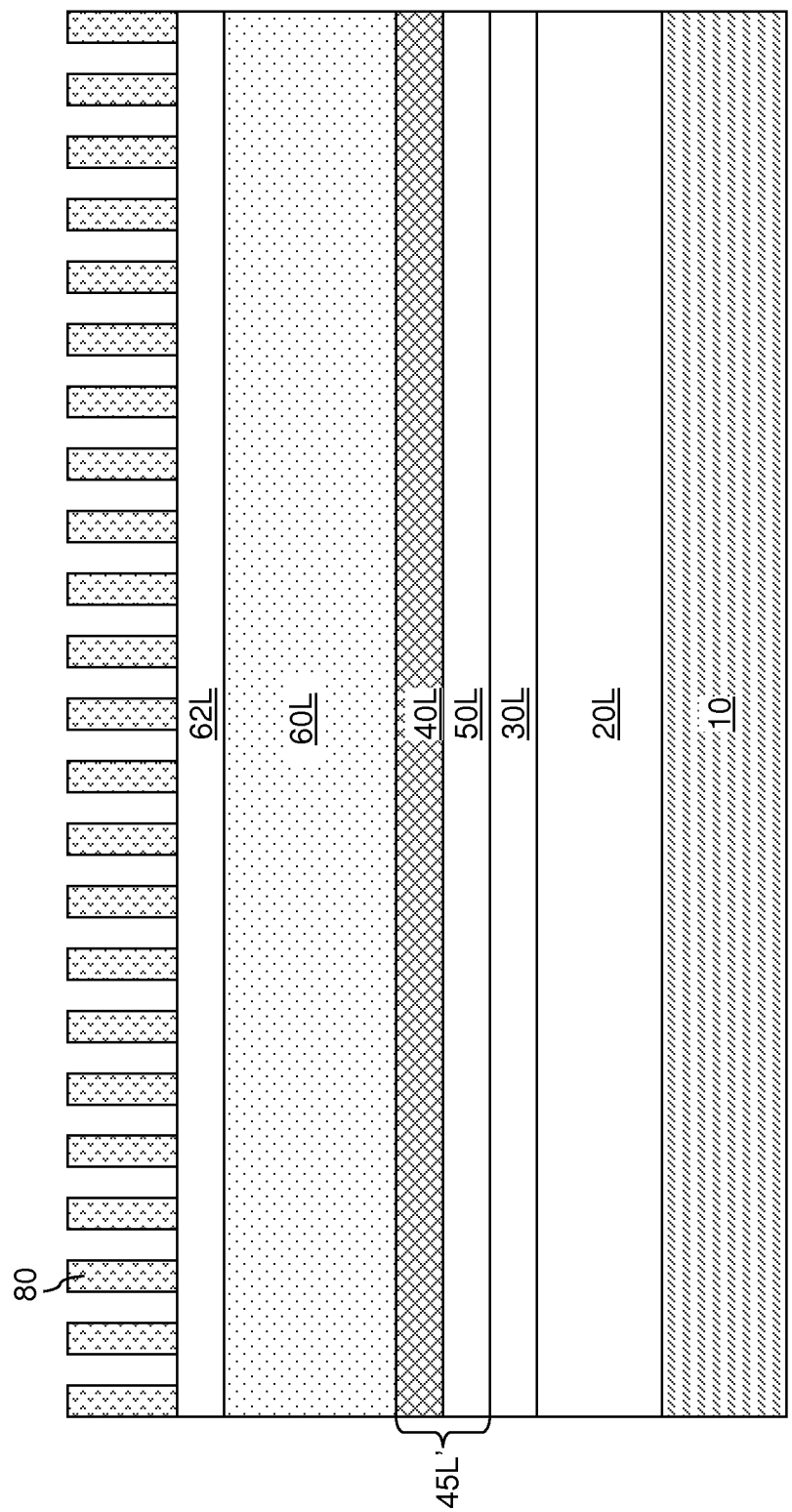
FIG. 27 is a vertical cross-sectional view of a fifth exemplary structure after deposition of an underlying material layer, and optional dielectric material layer, a metallic mask layer, a dielectric mask layer, a first organic planarizing layer (OPL), a first antireflective coating (ARC) layer, and a photoresist layer and lithographic patterning of the photoresist layer according to a fifth embodiment of the present disclosure.

Referring to FIG. 27, a fifth exemplary structure according to a fifth embodiment of the present disclosure can be derived from the second exemplary structure of FIG. 18 by not forming the mandrel structures 70 and by applying and lithographically patterning a photoresist layer to form a patterned photoresist layer 80 including a first pattern. The patterned photoresist layer 80 can include a set of photoresist material portions.

In one embodiment, the patterned structure has a pattern of a plurality of parallel lines. In one embodiment, the patterned structure includes a set of photoresist material portions having a lithographic minimum pitch. The processing step of FIG. 5 can be subsequently performed employing the patterned photoresist layer 80 as an etch mask. Processing steps of the second embodiment can be subsequently performed.

Figure 28:
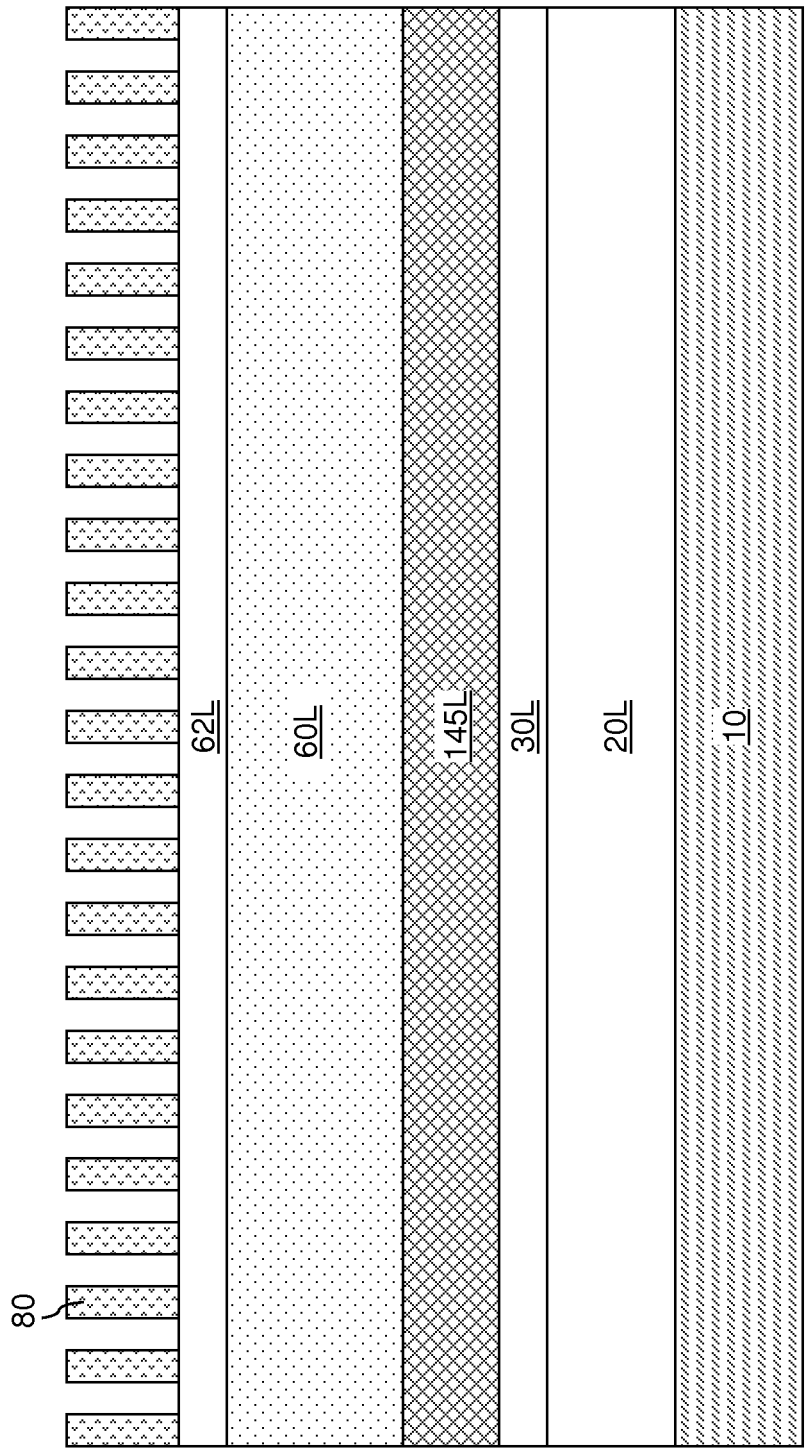
FIG. 28 is a vertical cross-sectional view of a sixth exemplary structure after deposition of an underlying material layer, and optional dielectric material layer, a mask layer, a first organic planarizing layer (OPL), a first antireflective coating (ARC) layer, and a photoresist layer and lithographic patterning of the photoresist layer according to a sixth embodiment of the present disclosure.

Referring to FIG. 28, a sixth exemplary structure according to a sixth embodiment of the present disclosure can be derived from the second exemplary structure of FIG. 22 by not forming the mandrel structures 70 and by applying and lithographically patterning a photoresist layer to form a patterned photoresist layer 80 including a first pattern. The patterned photoresist layer 80 can include a set of photoresist material portions.

In one embodiment, the patterned structure has a pattern of a plurality of parallel lines. In one embodiment, the patterned structure includes a set of photoresist material portions having a lithographic minimum pitch. The processing step of FIG. 5 can be subsequently performed employing the patterned photoresist layer 80 as an etch mask. Processing steps of the third embodiment can be subsequently performed.

Figure 29:
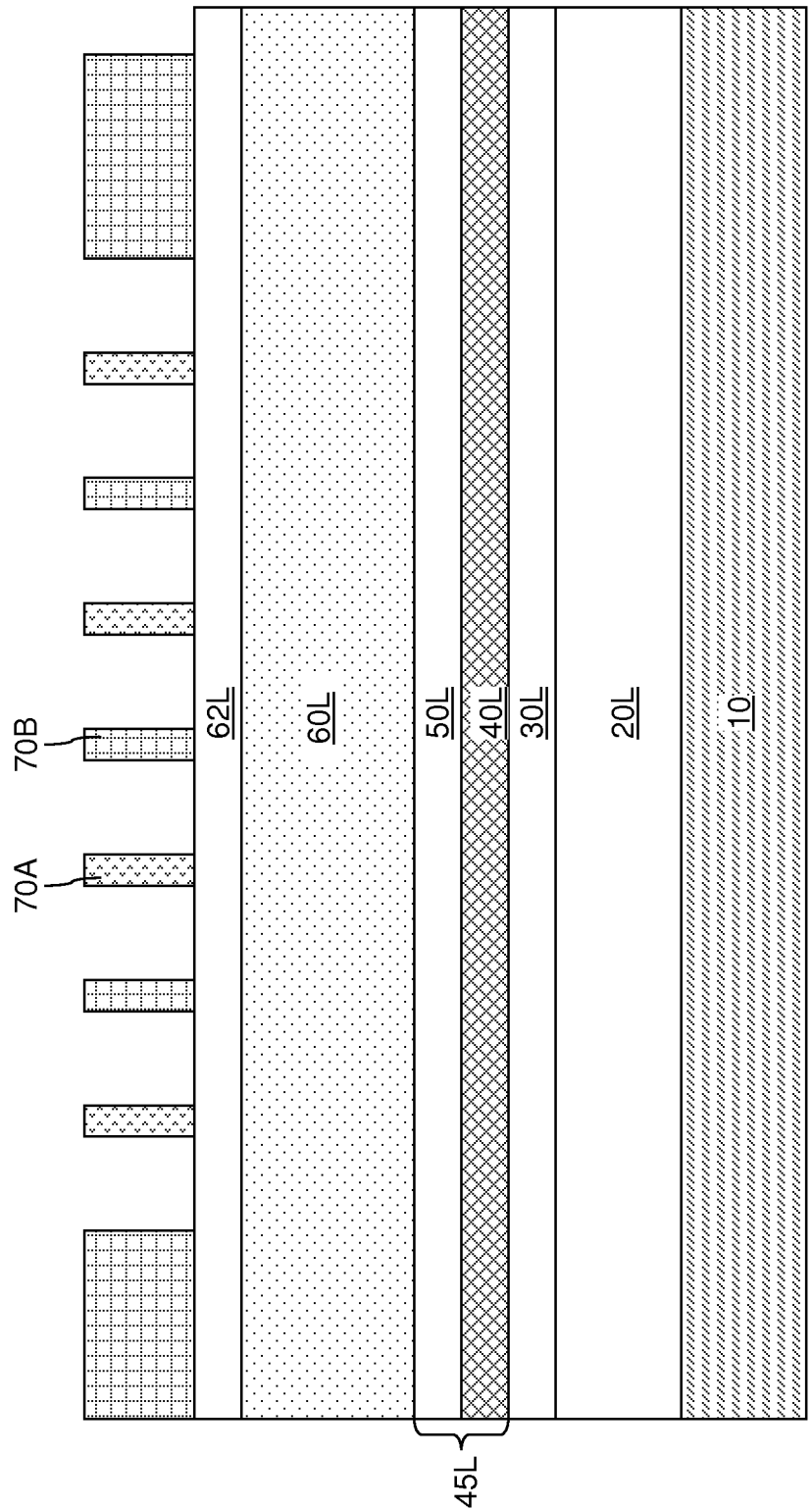
FIG. 29 is a vertical cross-sectional view of a seventh exemplary structure after deposition of an underlying material layer, and optional dielectric material layer, at least one mask layer, a first organic planarizing layer (OPL), a first antireflective coating (ARC) layer, and application and patterning of a primary photoresist layer, and application and patterning of a secondary photoresist layer according to a seventh embodiment of the present disclosure.

Referring to FIG. 29, a seventh exemplary structure a according to a seventh embodiment of the present disclosure can be derived from any of the fourth, fifth, and sixth exemplary structures illustrated in FIGS. 26, 27, and 28 by applying and patterning multiple photoresist layers instead of employing a single photoresist layer. For example, a primary photoresist layer 70A can be applied and lithographically patterned, and a secondary photoresist layer 70B can be subsequently applied and lithographically patterned.

The seventh exemplary structure illustrated in FIG. 29 is a lithographic structure, which includes the underlying material layer 20L located on the substrate 10; at least one mask layer 45L including at least one of a dielectric material and a metallic material and located over the underlying material layer 20L; the first organic planarizing layer (OPL) 60L located over the at least one mask layer 45L; the first antireflective coating (ARC) layer 62L located on the first OPL 60L; and the patterned structure of the spacer structures 72 located over the first ARC layer 62L.

In one embodiment, the patterned structure has a pattern of a plurality of parallel lines. In one embodiment, the patterned structure includes a set of first photoresist material portions including a first photoresist material (e.g., the primary photoresist layer 70A) and a set of second photoresist material portions including a second photoresist material that is different from the first photoresist material (e.g., the secondary photoresist layer 70B). The processing step of FIG. 5 can be subsequently performed employing the patterned photoresist layer 80 as an etch mask. Subsequently, processing steps of FIGS. 6-17 can be performed.

The various embodiments of the present disclosure enables high fidelity transfer of the derived pattern including at least the composite pattern of the first pattern and the second pattern, and optionally including an additional pattern (the third pattern). Due to the absence of any organic material within the at least one mask layer 45L, the material(s) of the at least one mask layer 45L is/are not prone to increase in line edge roughness or line width roughness during the transfer of the first pattern therein, or during the removal of the patterned first OPL 60, or during the removal of the second OPL 160L, or during the anisotropic etch that transfers the derived pattern into the underlying layers.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of patterning a structure comprising:
   forming an underlying material layer on a substrate;
   forming a stack of two mask layers comprising a dielectric material and a metallic material, respectively, over said underlying material layer;
   forming a first pattern in one of said two mask layers, wherein a patterned mask layer including said first pattern is formed by remaining portions of said one of said two mask layers, while another of said two mask layers remains unpatterned;
   forming an overlying structure including a second pattern over said patterned mask layer, wherein said second pattern includes at least one blocking area;
   removing portions of said patterned mask layer that do not underlie said blocking area, wherein remaining portions of said patterned mask layer include a composite pattern that is an intersection of said first pattern and said second pattern;
   applying a photoresist material directly on surfaces of said patterned mask layer and on surfaces of said another of said two mask layers that remains unpatterned;

patterning said photoresist material to form at least one photoresist block portion having an additional pattern directly on a topmost surface of said another of said two mask layers;

transferring a derived pattern including said composite pattern and a pattern of said at least one photoresist block portion as component patterns into said another of said two mask layers; and transferring said derived pattern into said underlying material layer employing remaining portions of said another of said two mask layers as an etch mask.

2. The method of claim 1, further comprising:

forming a stack of a first organic planarizing layer (OPL) and a first antireflective coating (ARC) layer on said at least one mask layer; and forming a patterned structure including said first pattern over said first ARC layer, wherein said forming of said first pattern in said one of said at least one mask layer comprises transferring said first pattern into said one of said at least one mask layer.

3. The method of claim 2, further comprising etching said first ARC layer and said first OPL employing said patterned structure as an etch mask, wherein a patterned first ARC layer and a patterned first OPL are formed.

4. The method of claim 3, wherein said transferring of said first pattern into said one of said at least one mask layer comprises etching said one of said at least one mask layer employing said patterned first ARC layer as an etch mask.

5. The method of claim 4, further comprising removing said patterned first OPL selective to said patterned mask layer prior to forming said overlying structure.

6. The method of claim 2, wherein said forming of said patterned structure comprises forming a set of spacer structures.

7. The method of claim 6, wherein said set of spacer structures is formed by:

forming mandrel structures over said first ARC layer;

depositing a conformal material layer over said mandrel structures; and anisotropically etching said conformal material layer, wherein remaining disjoined portions of said conformal material layer are said set of spacer structures.

8. The method of claim 7, further comprising removing said mandrel structures selective to said set of spacer structures and said first ARC layer.

9. The method of claim 7, wherein said forming of said mandrel structures comprise:

depositing a mandrel material layer over said first ARC layer; and patterning said mandrel material layer to form said mandrel structures.

10. The method of claim 2, wherein said patterned structure comprises a set of first photoresist material portions comprising a first photoresist material and a set of second photoresist material portions comprising a second photoresist material that is different from said first photoresist material.

11. The method of claim 2, wherein said forming of said overlying structure comprises forming a stack of a second OPL, a second ARC layer, and a photoresist layer over said patterned mask layer.

12. The method of claim 11, further comprising lithographically patterning said photoresist layer with said second pattern, wherein said second pattern includes at least one opening that is a complement of said at least one blocking area.

13. The method of claim 12, further comprising etching said second ARC layer and an upper portion of said second OPL employing said photoresist layer as an etch mask.

14. The method of claim 13, wherein said removing of said portions of said patterned mask layer that do not underlie said blocking area comprises etching said portions of said patterned mask layer from within an area of said at least one opening after said etching of said upper portion of said second OPL.

15. The method of claim 14, further comprising removing remaining portions of said second OPL selective to said remaining portions of said patterned mask layer.

16. The method of claim 1, wherein said transferring of said derived pattern into said underlying material layer comprises etching said underlying material layer employing a combination of said remaining portions of said patterned mask layer and said at least one photoresist block portion as an etch mask.

17. The method of claim 1, wherein said derived pattern is a union of said composite pattern and said additional pattern.

18. The method of claim 1, wherein said underlying material layer comprises a gate conductor layer.

19. The method of claim 1, further comprising removing said remaining portions of said patterned mask layer selective to said underlying material layer after said transferring of said derived pattern.

20. The method of claim 1, wherein said at lest one mask layer comprises a stack, from bottom to top, of a dielectric mask layer and a metallic mask layer.

21. The method of claim 1, wherein said at least one mask layer comprises a stack, from bottom to top, of a metallic mask layer and a dielectric material layer.

22. The method of claim 1, wherein said at least one mask layer consists of a dielectric mask layer.

23. The method of claim 1, wherein said at least one mask layer consists of a metallic mask layer.

24. The method of claim 1, further comprising removing said remaining portions of said patterned mask layer selective to remaining portions of said another of said two mask layers after said transferring of said derived pattern.

* * * * *